United States Patent
Kuwahara et al.

(10) Patent No.: US 11,276,719 B2
(45) Date of Patent: Mar. 15, 2022

(54) SOLID-STATE IMAGING DEVICE AND DISTANCE-MEASURING IMAGING DEVICE

(71) Applicant: PANASONIC INTELLECTUAL PROPERTY MANAGEMENT CO., LTD., Osaka (JP)

(72) Inventors: Takashi Kuwahara, Osaka (JP); Junichi Matsuo, Osaka (JP); Mitsugu Yoshita, Kyoto (JP)

(73) Assignee: NUVOTON TECHNOLOGY CORPORATION JAPAN, Kyoto (JP)

(*) Notice: Subject to any disclaimer, the term of this patent is extended or adjusted under 35 U.S.C. 154(b) by 378 days.

(21) Appl. No.: 16/421,071

(22) Filed: May 23, 2019

(65) Prior Publication Data
US 2019/0280030 A1    Sep. 12, 2019

Related U.S. Application Data

(63) Continuation of application No. PCT/JP2017/041185, filed on Nov. 16, 2017.

(30) Foreign Application Priority Data

Nov. 29, 2016 (JP) .............................. JP2016-231847

(51) Int. Cl.
H01L 27/14      (2006.01)
H01L 27/146     (2006.01)
(Continued)

(52) U.S. Cl.
CPC .......... *H01L 27/14607* (2013.01); *G01C 3/06* (2013.01); *G01S 17/10* (2013.01);
(Continued)

(58) Field of Classification Search
CPC ......... H01L 27/14607; H01L 27/14645; H01L 27/14649; G01S 17/10; G01S 17/894
See application file for complete search history.

(56) References Cited

U.S. PATENT DOCUMENTS

2011/0085043 A1    4/2011   Kamiyama
2014/0009647 A1    1/2014   Hayashi et al.
(Continued)

FOREIGN PATENT DOCUMENTS

CN    105284192 A    1/2016
CN    105574525 A    5/2016
(Continued)

OTHER PUBLICATIONS

Chinese Office Action dated Mar. 31, 2021 issued in corresponding Chinese Patent Application No. 201780072165.1 with translation of English Search Report.
(Continued)

*Primary Examiner* — Kevin K Pyo
(74) *Attorney, Agent, or Firm* — McDermott Will & Emery LLP

(57) ABSTRACT

A solid-state imaging device includes: an imager including pixels arranged in rows and columns; vertical transfer portions in one-to-one correspondence with columns of the pixels, each of which includes a readout electrode that reads out signal charges generated in the pixels and a transfer electrode that transfers the read-out signal charges in the column direction; and a horizontal transfer portion which transfers, in the row direction, the signal charges transferred by the vertical transfer portions, and outputs the signal charges. The imager is formed by alternately disposing, in the column direction, a first row in which visible light pixels each including a first photoelectric converter that converts visible light into signal charges are arranged adjacent in the row direction and a second row in which infrared light pixels each including a second photoelectric converter that converts infrared light into signal charges are arranged adjacent in the row direction.

6 Claims, 20 Drawing Sheets

(51) Int. Cl.
*G01S 17/10* (2020.01)
*G01C 3/06* (2006.01)
*H04N 5/3728* (2011.01)
*H01L 27/148* (2006.01)
*H04N 5/33* (2006.01)
*G01S 17/894* (2020.01)

(52) U.S. Cl.
CPC .......... *G01S 17/894* (2020.01); *H01L 27/148* (2013.01); *H01L 27/14645* (2013.01); *H01L 27/14649* (2013.01); *H04N 5/33* (2013.01); *H04N 5/3728* (2013.01)

(56) References Cited

U.S. PATENT DOCUMENTS

| | | |
|---|---|---|
| 2014/0376790 A1 | 12/2014 | Mostafavi |
| 2015/0092019 A1 | 4/2015 | Asano et al. |
| 2015/0160340 A1 | 6/2015 | Grauer et al. |
| 2015/0341573 A1 | 11/2015 | Matsuo et al. |
| 2017/0150077 A1 | 5/2017 | Matsuo |
| 2021/0160446 A1* | 5/2021 | Otani ................ G01S 7/486 |

FOREIGN PATENT DOCUMENTS

| | | |
|---|---|---|
| JP | 2011-082859 A | 4/2011 |
| JP | 2014-017615 A | 1/2014 |
| JP | 2015-527761 A | 9/2015 |
| WO | 2014/002415 A1 | 1/2014 |
| WO | 2014/122714 A1 | 8/2014 |
| WO | 2016/031171 A1 | 3/2016 |

OTHER PUBLICATIONS

International Search Report and Written Opinion dated Jan. 30, 2018 in International Application No. PCT/JP2017/041185; with partial English translation.
Japanese Office Action dated Sep. 28, 2021, issued in corresponding Japanese Patent Application No. 2018-553761.

* cited by examiner

SOLID-STATE IMAGING DEVICE AND DISTANCE-MEASURING IMAGING DEVICE

CROSS REFERENCE TO RELATED APPLICATIONS

This application is a U.S. continuation application of PCT International Patent Application Number PCT/JP2017/041185 filed on Nov. 16, 2017, claiming the benefit of priority of Japanese Patent Application Number 2016-231847 filed on Nov. 29, 2016, the entire contents of which are hereby incorporated by reference.

BACKGROUND

1. Technical Field

The present disclosure relates to a solid-state imaging device and a distance-measuring imaging device which generates a distance image using the solid-state imaging device.

2. Description of the Related Art

Conventionally, various techniques have been proposed regarding a distance-measuring imaging device (what is called a rangefinder camera) which generates a distance image (refer to International Publications No. WO2014/002415 and No. WO2016/031171). Here, the distance image indicates the distance to a subject in units of pixels included in the image.

The distance-measuring imaging device disclosed in Internal Publication No. WO2014/002415 includes: a light source unit which emits infrared light toward a subject; and a solid-state imaging device (what is called an image sensor) which receives infrared light reflected by the subject. The solid-state imaging device includes an imager in which only infrared light pixels that receive infrared light are arranged in rows and columns, and upon reading out signal charges generated in the infrared light pixels, adds up and reads out signal charges obtained from two infrared light pixels adjacent to each other in the row direction, thereby causing an increase in sensitivity to twice as high as that in the case where signal charges are read out from the infrared light pixels separately. Thus, a distance image is generated with high sensitivity.

The distance-measuring imaging device disclosed in Internal Publication No. WO2016/031171 includes: a light source unit which emits infrared light toward a subject; and a solid-state imaging device which receives not only infrared light reflected by the subject, but also visible light. The solid-state imaging device includes an imager in which infrared pixels that receive infrared light and visible light pixels that receive visible light are alternately arranged in each of row and column directions (checkered pattern). Thus, a distance image is generated by reading out signal charges generated in the infrared light pixels, and in addition, a visible image is generated by reading out signal charges generated in the visible light pixels; since the distance to a subject can be obtained as two-dimensional data and moreover, the luminance of the subject can also be obtained, the shape, pattern, etc., of the subject are recognized, for example, even in a black area where infrared light is less likely to be reflected, leading to wider applications of the distance-measuring imaging device.

SUMMARY

However, the distance-measuring imaging device disclosed in Internal Publication No. WO2014/002415 has a problem in that only a distance image can be obtained (meaning that no visible image can be obtained) although the distance image is generated with high sensitivity.

Meanwhile, the distance-measuring imaging device disclosed in Internal Publication No. WO2016/031171 has a problem in that, although a distance image and a visible image are generated, since the infrared light pixels are not disposed adjacent to each other in the row direction, signal charges obtained from two infrared light pixels cannot be added up and thus the distance image cannot be obtained with high sensitivity.

Thus, an object of the present disclosure is to provide a solid-state imaging device and a distance-measuring imaging device which generate a distance image and a visible image and are suited to generate the distance image with high sensitivity.

In order to achieve the aforementioned object, a solid-state imaging device according to one aspect of the present disclosure includes an imager including a plurality of pixels arranged in rows and columns. The imager includes: visible light pixels each including a first photoelectric converter which converts light in an entire wavelength range of visible light into a signal charge in order to generate a visible image; and infrared light pixels each including a second photoelectric converter which converts infrared light into a signal charge in order to generate an infrared light image and a distance image indicating a time-of-flight (TOF) distance to a subject.

Furthermore, in order to achieve the aforementioned object, a distance-measuring imaging device according to one aspect of the present disclosure includes: a light source unit which emits infrared light; the above-described solid-state imaging device; a control circuit which controls the light source unit and the solid-state imaging device to cause the visible light pixels to receive visible light and further cause the infrared light pixels to receive reflected light obtained by reflecting, by the subject, the infrared light emitted by the light source unit; and a signal processing circuit which generates the visible image by reading out signal charges generated in the visible light pixels and generates the distance image and the infrared light image by reading out signal charges generated in the infrared light pixels.

According to the present disclosure, a solid-state imaging device and a distance-measuring imaging device which generate a distance image and a visible image and are suited to generate the distance image with high sensitivity are provided.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT

Figure 1:
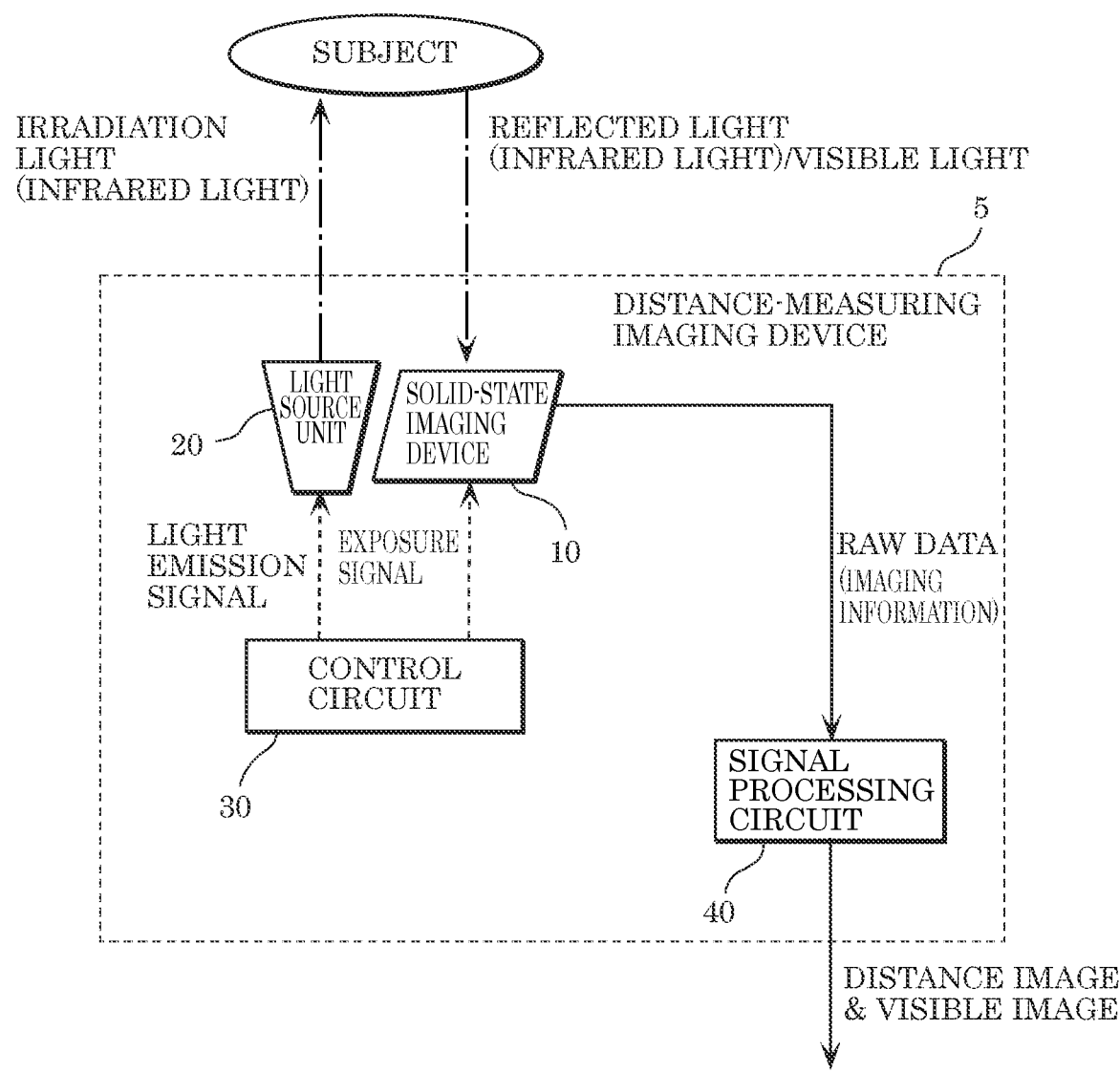
FIG. 1 is a block diagram illustrating a configuration of a distance-measuring imaging device according to an embodiment.

Hereinafter, an embodiment of the present disclosure will be described in detail with reference to the drawings. The embodiment described below shows a specific example of the present disclosure. The numerical values, shapes, materials, structural elements, the arrangement and connection of the structural elements, drive timing, etc. shown in the following embodiment are mere examples, and therefore do not limit the present disclosure. As such, among the structural elements in the following embodiment, structural elements not recited in any one of the independent claims which indicate the broadest concepts of the present disclosure will be described as arbitrary structural elements. Furthermore, the respective figures are not necessarily precise illustrations. Elements that are essentially the same share the same reference numerals in the respective figures, and there are cases where overlapping explanations thereof are omitted or simplified.

FIG. 1 is a block diagram illustrating a configuration of distance-measuring imaging device 5 according to the embodiment.

Distance-measuring imaging device 5 is a rangefinder camera capable of generating a distance image and a visible image and generating the distance image with high sensitivity, and includes solid-state imaging device 10, light source unit 20, control circuit 30, and signal processing circuit 40.

Light source unit 20 is a light source which emits infrared light toward a subject and includes, for example, a capacitor, a drive circuit, and a light-emitting element such as a laser diode (LD) or a light-emitting diode (LED). Infrared light is emitted as a result of a charge held in the capacitor being supplied to the light-emitting element under control of the drive circuit.

Solid-state imaging device 10 is an image sensor which generates a distance image and a visible image and is suited to generate the distance image with high sensitivity, is a circuit which performs exposure to infrared light and exposure to visible light under control of control circuit 30, generates RAW data (imaging information) that is source information for the distance image and the visible image, and outputs the RAW data, and is implemented, for example, as a single-chip semiconductor circuit.

Control circuit 30 controls light source unit 20 and solid-state imaging device 10 by outputting thereto a light emission signal and an exposure signal, respectively, causing visible light pixel 12 included in solid-state imaging device 10 to receive visible light and causing infrared light pixel 13 included in solid-state imaging device 10 to receive reflected light obtained by reflecting, by a subject, the infrared light emitted by light source unit 20, and is, for example, a timing generation circuit.

Signal processing circuit 40 generates a visible image of a subject by reading out signal charges generated in visible light pixels 12 included in solid-state imaging device 10 and generates a distance image indicating the distance to the subject by reading out signal charges generated in infrared light pixels 13 included in solid-state imaging device 10; specifically, signal processing circuit 40 receives the RAW data (imaging information) from solid-state imaging device 10, holds the RAW data, performs a necessary calculation process (process of calculating the distance using the RAW data read out from infrared light pixel 13), and includes, for example, a read-only memory (ROM) in which a program is stored, a random-access memory in which information is temporarily held, a processor which performs the program, and input/output ports. Note that signal processing circuit 40 may generate not only a distance image, but also an infrared light image, by reading out the signal charges generated in infrared light pixels 13 included in solid-state imaging device 10. The infrared light image is generated using the RAW data read out from infrared light pixel 13.

Note that as distance-measuring imaging device 5, it is also possible to provide, for example, an optical system such as an optical lens not illustrated in FIG. 1, a drive mechanism which moves the optical lens, a display which displays the generated visible image and the generated distance image, an auxiliary memory which stores the generated visible and distance images, and an input device (button, touch panel) which receives an instruction from an operator.

Figure 2:
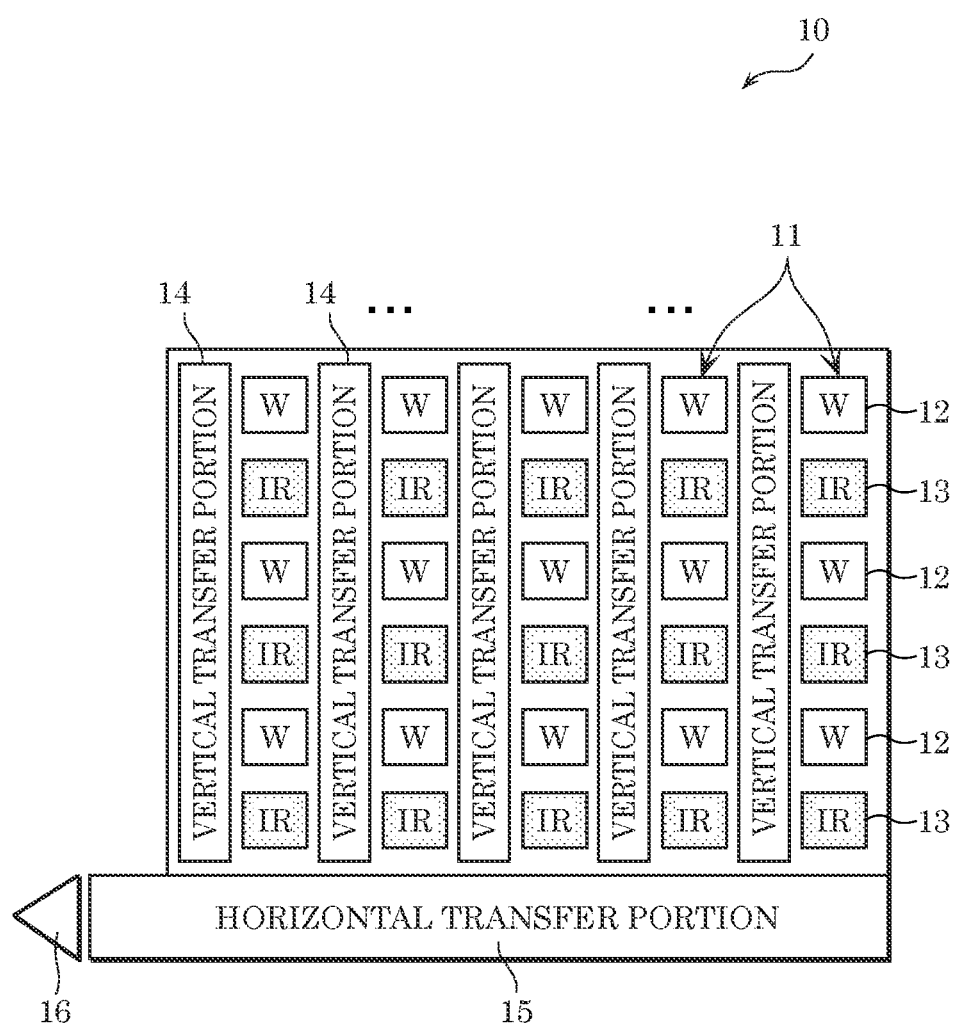
FIG. 2 is a block diagram illustrating a detailed configuration of a solid-state imaging device illustrated in FIG. 1.

FIG. 2 is a block diagram illustrating a detailed configuration of solid-state imaging device 10 illustrated in FIG. 1.

Solid-state imaging device 10 is a charge coupled device (CCD) image sensor and includes imager 11, a plurality of vertical transfer portions 14, horizontal transfer portion 15, and signal charge detector 16.

Imager 11 includes a plurality of pixels (visible light pixels 12 and infrared light pixels 13) formed on a semiconductor substrate and arranged in rows and columns. Imager 11 is formed by alternately disposing, in the column direction, a first row in which visible light pixels 12 each including a first photoelectric converter that converts visible light into a signal charge are arranged adjacent to each other in the row direction; and a second row in which infrared light pixels 13 each including a second photoelectric converter that converts infrared light into a signal charge are arranged adjacent to each other in the row direction. In other words, visible light pixels 12 and infrared light pixels 13 are disposed in stripes extending in the row direction.

Visible light pixel 12 includes, for example: an optical filter which allows passage of visible light (white light) only (in other words, blocks infrared light); a microlens; a light-receiving element serving as the first photoelectric converter; and an accumulator in which a charge generated in the light-receiving element is accumulated. Note that the optical filter may allow passage of both visible light and infrared light or may be a color filter which allows passage of only light in a specific wavelength range of visible light, such as red (R), green (G), and blue (B) light.

Infrared light pixel 13 includes, for example: an optical filter which passes infrared light only; a microlens; a light-receiving element serving as the second photoelectric converter; and an accumulator in which a charge generated in the light-receiving element is accumulated.

In other words, as a result of providing optical filters having different structures above the first photoelectric converter and the second photoelectric converter, light rays in different wavelength ranges reach the respective photoelectric converters, and the first photoelectric converter and the second photoelectric converter have the same impurity region structure (well structure). However, the impurity region structure (well structure) of each of the first photoelectric converter and the second photoelectric converter can be changed according to the wavelength range.

Vertical transfer portions 14 are provided in one-to-one correspondence with the columns of the plurality of pixels (visible light pixels 12 and infrared light pixels 13) and include: readout electrodes (readout gates) which read out the signal charges generated in the plurality of pixels; and transfer electrodes (transfer gates) which transfer the readout signal charges in the column direction. Note that more specifically, vertical transfer portion 14 includes a drive circuit (not illustrated in the drawings) which applies driving voltages to the readout electrode and the transfer electrodes at predetermined timing (for example, performs a 10-phase drive in which a total of 10 types of gates are driven), reads out, according to drive signals from the drive circuit, charges generated in visible light pixels 12 and infrared light pixels 13, and transfers the charges in the column direction.

Horizontal transfer portion 15 transfers, in the row direction, the signal charges transferred by vertical transfer portions 14, and outputs the signal charges to signal charge detector 16.

Signal charge detector 16 is an output circuit which outputs, as a voltage, the signal charges transferred by horizontal transfer portion 15.

Note that solid-state imaging device 10 is a CCD image sensor in the present embodiment, but may be a CMOS image sensor.

Next, the operation of distance-measuring imaging device 5 according to the present embodiment configured as described above will be described.

First Readout Example

Figure 3:
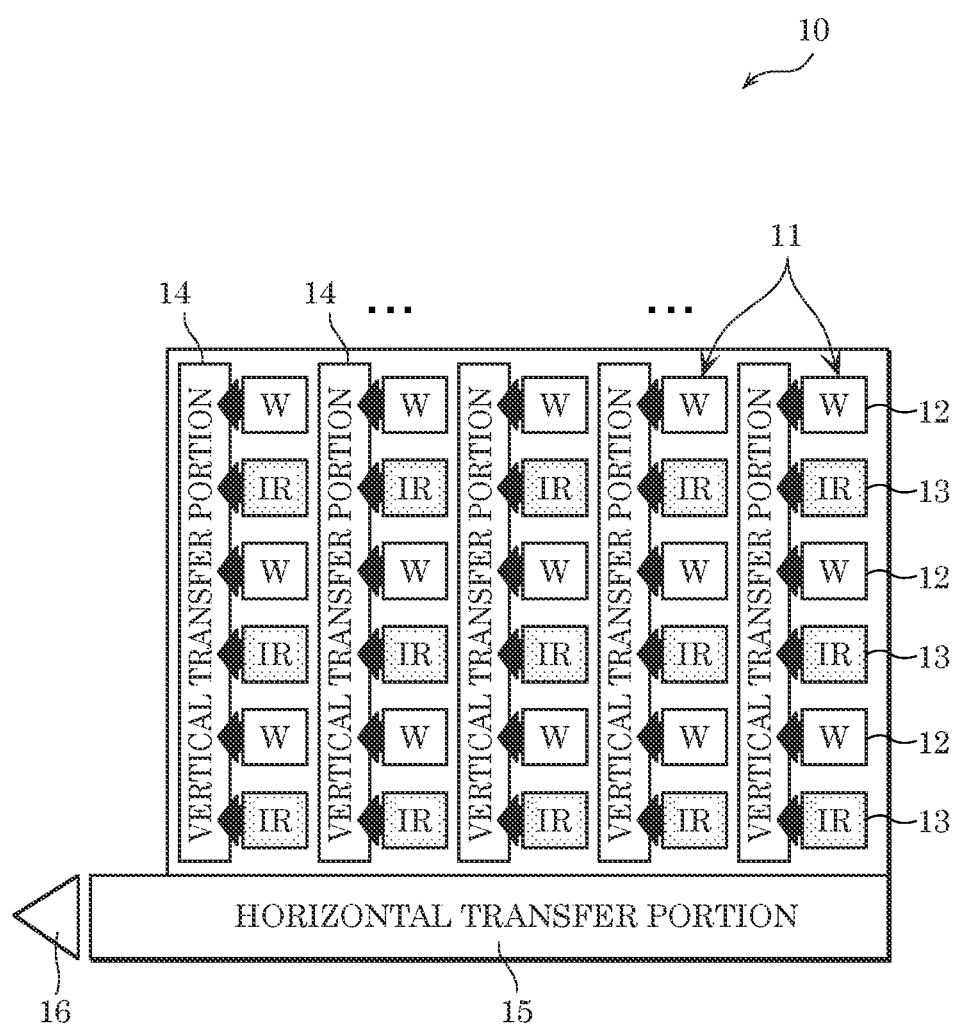
FIG. 3 is a diagram illustrating a first example of reading out signal charges by the solid-state imaging device illustrated in FIG. 1.

FIG. 3 is a diagram illustrating the first example of reading out signal charges by solid-state imaging device 10 illustrated in FIG. 1. Here is shown an operation of vertical transfer portion 14 in which the readout electrodes read out signal charges from visible light pixels 12 and infrared light pixels 13 separately.

By way of such readout, signal processing circuit 40 can generate a visible image from only RAW data corresponding to the signal charges read out from visible light pixels 12 and in addition, generate a distance image from only RAW data corresponding to the signal charges read out from infrared light pixels 13.

Figure 4:
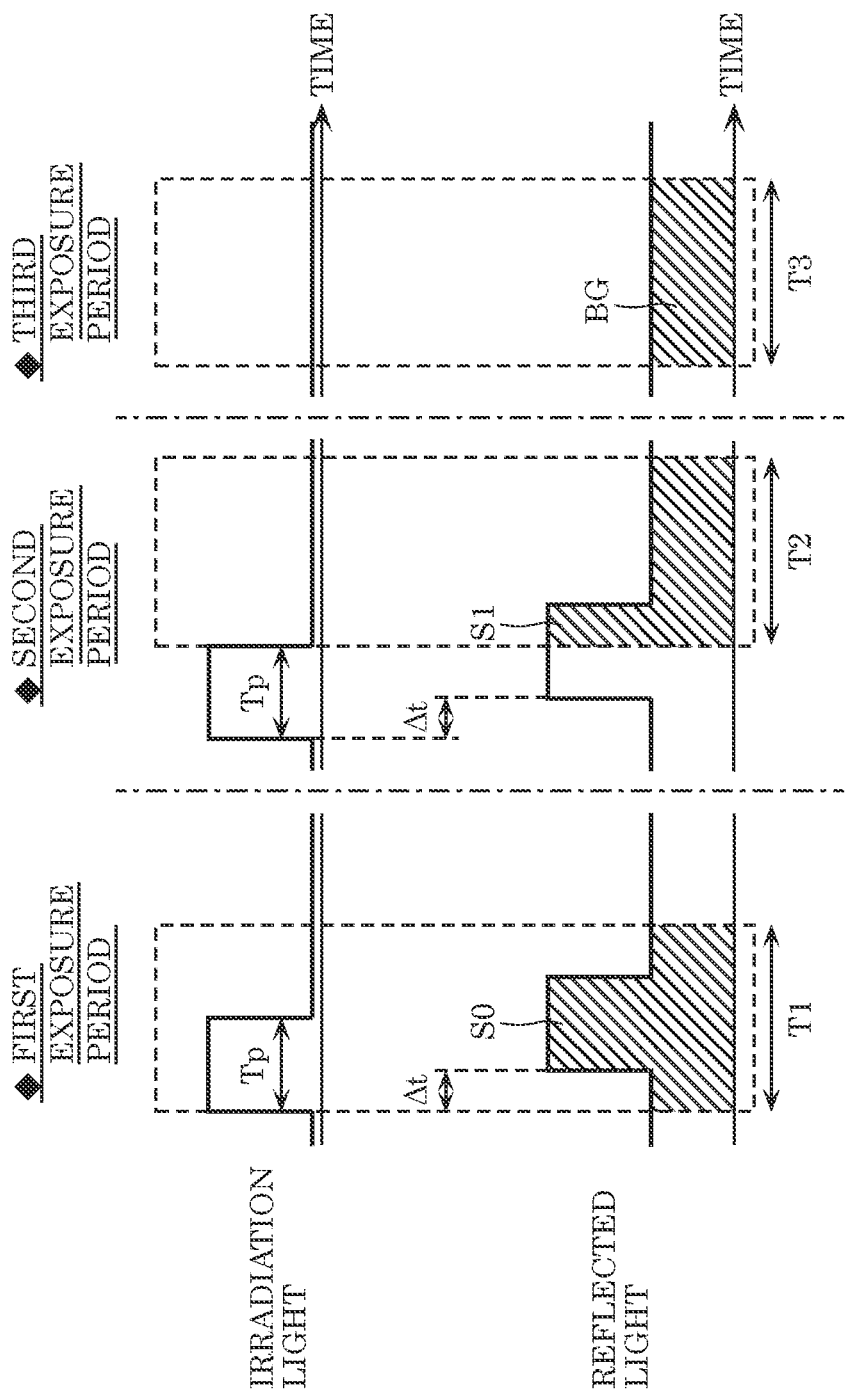
FIG. 4 is a diagram for describing a principle in which a distance image is generated in a distance-measuring imaging device according to an embodiment.

FIG. 4 is a diagram for describing a principle in which a distance image is generated in distance-measuring imaging device 5 according to the embodiment. Here is shown a principle in which a distance image is generated using a time-of-flight (TOF) method.

In the TOF, under control of control circuit 30, pulsed infrared light is emitted from light source unit 20, and solid-state imaging device 10 receives light reflected by a subject in two types of exposure periods (first exposure period and second exposure period), thereby reads out two types of signal charges S0, S1 from infrared light pixels 13, accumulates signal charges S0, S1 in packets in vertical transfer portions 14, further receives background light in the third exposure period while infrared light is not emitted, reads out signal charges BG (signal charges corresponding to the background), and accumulates signal charges BG in other packets in vertical transfer portions 14. Signal charges S0, S1, BG accumulated in the three types of packets are sequentially transferred by vertical transfer portions 14 and are output via horizontal transfer portion 15 and signal charge detector 16. Signal processing circuit 40 generates a distance image by calculating the distance to the subject for each pixel from the difference and ratio between signal charges S0, S1, BG. Note that the packets are memory cells in which the signal charges read out from the pixels are accumulated, and correspond to sections of vertical transfer portions 14 which accumulate and transfer the signal charges.

More specifically, the first exposure period starting from a rising-edge time of irradiation light having pulse width Tp is denoted as T1, the second exposure period starting from a falling-edge time of the irradiation light is denoted as T2, the third exposure period in which light source unit 20 is OFF is denoted as T3, and exposure periods T1-T3 are set longer than pulse width Tp. Assuming that the signal charge generated in infrared light pixel 13 in first exposure period T1 is denoted as S0, the signal charge generated in infrared light pixel 13 in second exposure period T2 is denoted as S1, and the signal charge generated in infrared light pixel 13 in third exposure period T3 is denoted as BG, delay time $\Delta t$ is given according to the following equation.

$$\Delta t = Tp\{(S1-BG)/(S0-BG)\}$$

This delay time Δt has a value corresponding to the distance to a subject.

Thus, signal processing circuit 40 calculates delay time Δt for each pixel according to the above equation using signal charges S0, S1, BG, and determines the distance to the subject, thereby generating a distance image.

Note that the timing of exposure in the TOF method is not limited to that illustrated in FIG. 4; first exposure period T1 may be set to match the pulse timing of irradiation light or may be set shorter than a period defined by the pulse timing of irradiation light, second exposure period T2 may be set to a period starting from emission of irradiation light and ending after a length of time shorter than pulse width Tp of the irradiation light, and third exposure period T3 may be set to zero (in other words, third exposure period T3 need not be provided).

Second Readout Example

Figure 5:
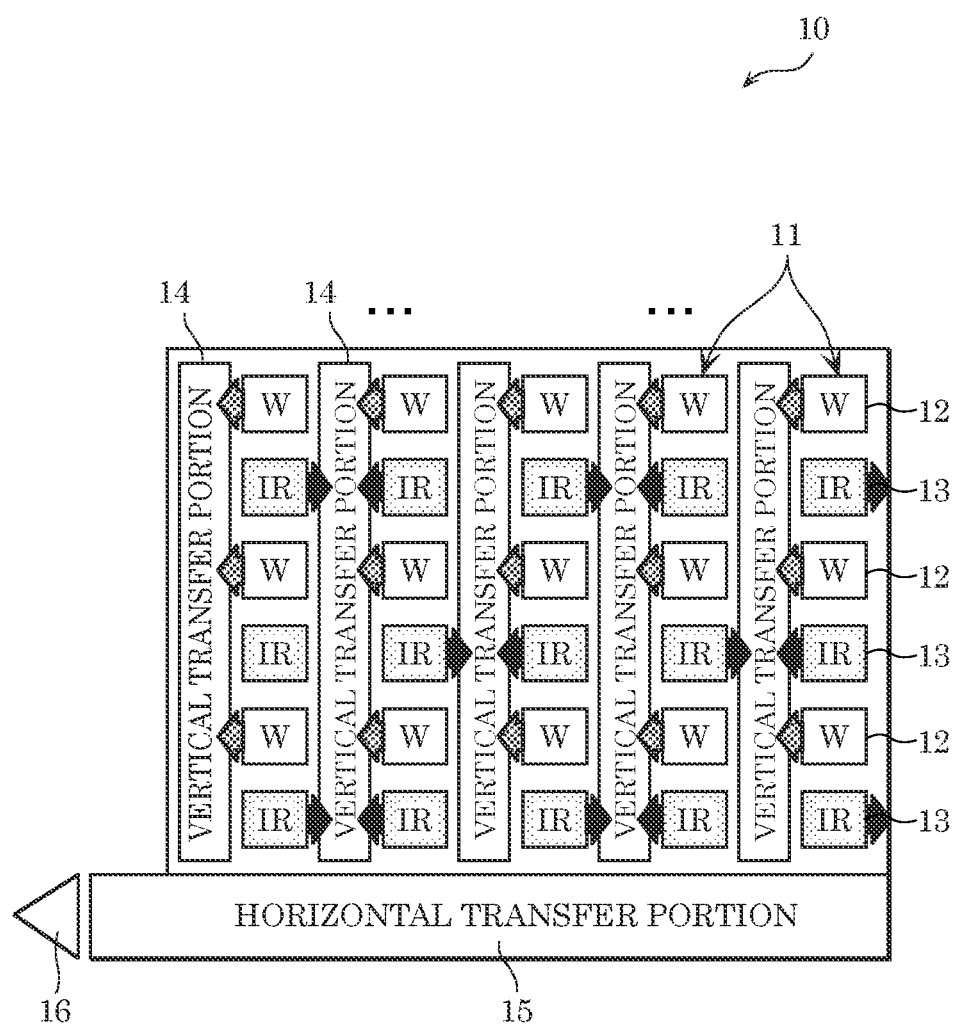
FIG. 5 is a diagram illustrating a second example of reading out signal charges by the solid-state imaging device illustrated in FIG. 1.

FIG. 5 is a diagram illustrating the second example of reading out signal charges by solid-state imaging device 10 illustrated in FIG. 1. Here is shown a situation in which vertical transfer portion 14 reads out signal charges from visible light pixels 12 separately using the readout electrodes, but for infrared light pixels 13, reads out signal charges generated in two infrared light pixels 13 adjacent to each other in the second row (in other words, in the row direction), to sections (packets) of vertical transfer portion 14 that are located in identical positions in the column direction, and adds up the signal charges (2-pixel addition).

Note that in the readout example illustrated in FIG. 5, the signal charges generated in pairs of two adjacent infrared light pixels 13 are read out to both of vertical transfer portions 14 in the odd-numbered columns and vertical transfer portions 14 in the even-numbered columns. As a result, the spatial resolution (definition) in the row direction becomes higher than in the case where the signal charges are read out to only one of vertical transfer portions 14 in the odd-numbered columns and vertical transfer portions 14 in the even-numbered columns.

Figure 6:
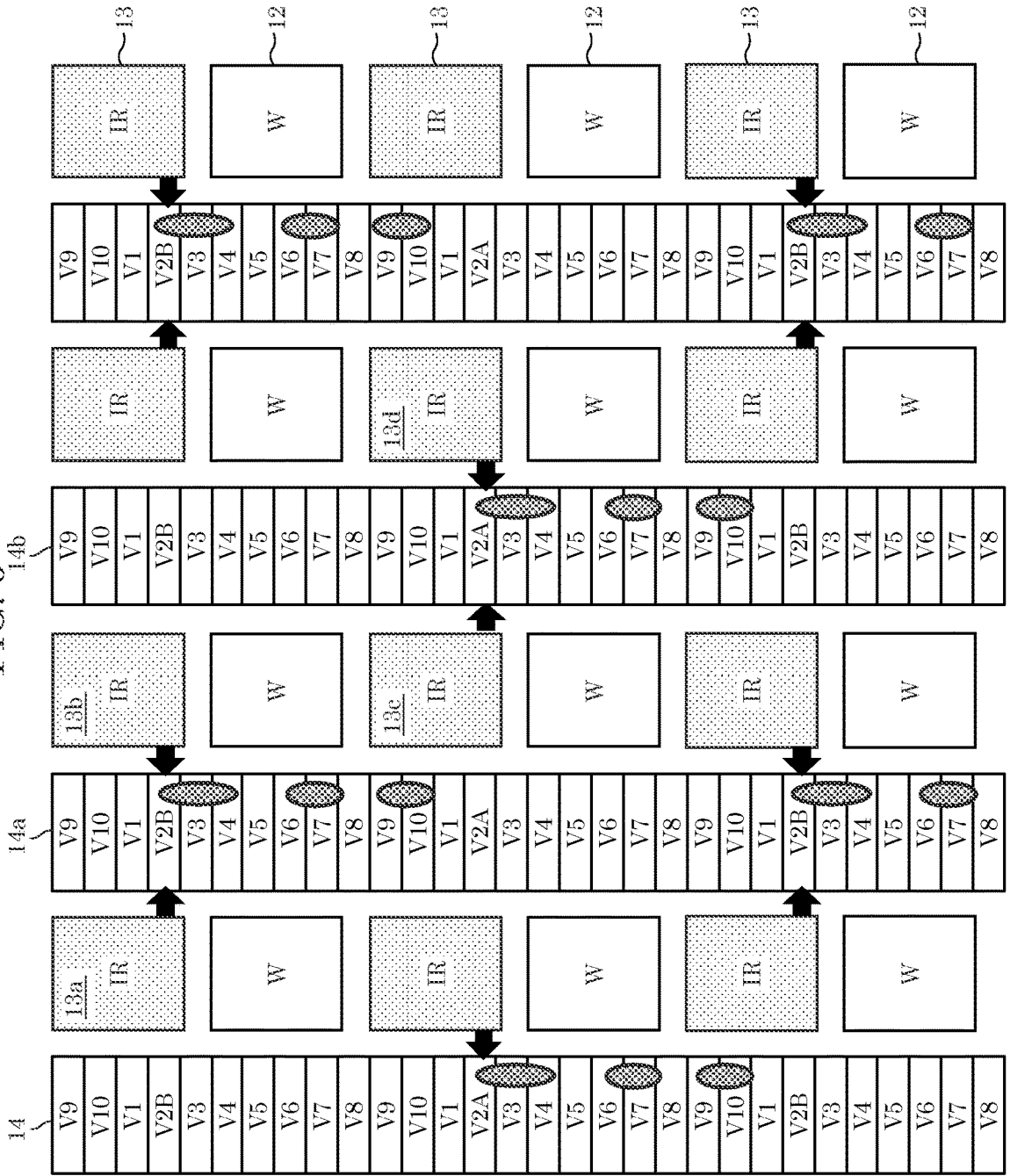
FIG. 6 is a diagram illustrating signal charge readout and charge accumulation from infrared light pixels in the second readout example illustrated in FIG. 5.

FIG. 6 is a diagram illustrating signal charge readout and charge accumulation (packets) from infrared light pixels 13 in the second readout example illustrated in FIG. 5.

Here, as illustrated in the drawing, vertical transfer portion 14 includes ten transfer electrodes (V1, V2A/V2B, V3-V10) for each pair of two pixels adjacent to each other in the column direction. Note that transfer electrodes V2A and V2B serve also as readout electrodes which read out signal charges from infrared light pixels 13 to vertical transfer portions 14. Transfer electrodes V4 serve also as readout electrodes which read out signal charges from visible light pixels 12 to vertical transfer portions 14.

Focusing on two infrared light pixels 13a and 13b adjacent to each other in the odd-numbered row among the second rows in which infrared light pixels 13 are arranged in FIG. 6, vertical transfer portion 14a in the even-numbered column simultaneously reads out, using shared readout electrode V2B, the signal charges generated in two infrared light pixels 13a and 13b, to sections (packets) of vertical transfer portion 14a that are located in identical positions in the column direction. Subsequently, vertical transfer portion 14a transfers the packet in the column direction (more specifically, downward). Such readout from two infrared light pixels 13a and 13b and transfer in the column direction are repeatedly applied to signal charge S0 obtained in first exposure period T1, signal charge S1 obtained in second exposure period T2, and signal charge BG obtained in third exposure period T3.

Furthermore, focusing on two infrared light pixels 13c and 13d adjacent to each other in the even-numbered row among the second rows in which infrared light pixels 13 are arranged in FIG. 6, vertical transfer portion 14b in the odd-numbered column simultaneously reads out, using shared readout electrode V2A, the signal charges generated in two infrared light pixels 13c and 13d, to sections (packets) of vertical transfer portion 14b that are located in identical positions in the column direction. Subsequently, vertical transfer portion 14b transfers the packet in the column direction (more specifically, downward). Such readout from two infrared light pixels 13c and 13d and transfer in the column direction are repeatedly applied to signal charge S0 obtained in first exposure period T1, signal charge S1 obtained in second exposure period T2, and signal charge BG obtained in third exposure period T3.

Subsequently, while remaining stored in the packets, signal charges S0, S1, and BG read out to vertical transfer portions 14a and 14b are transferred in the column direction and are then output to signal processing circuit 40 via horizontal transfer portion 15 and signal charge detector 16.

Figure 7:
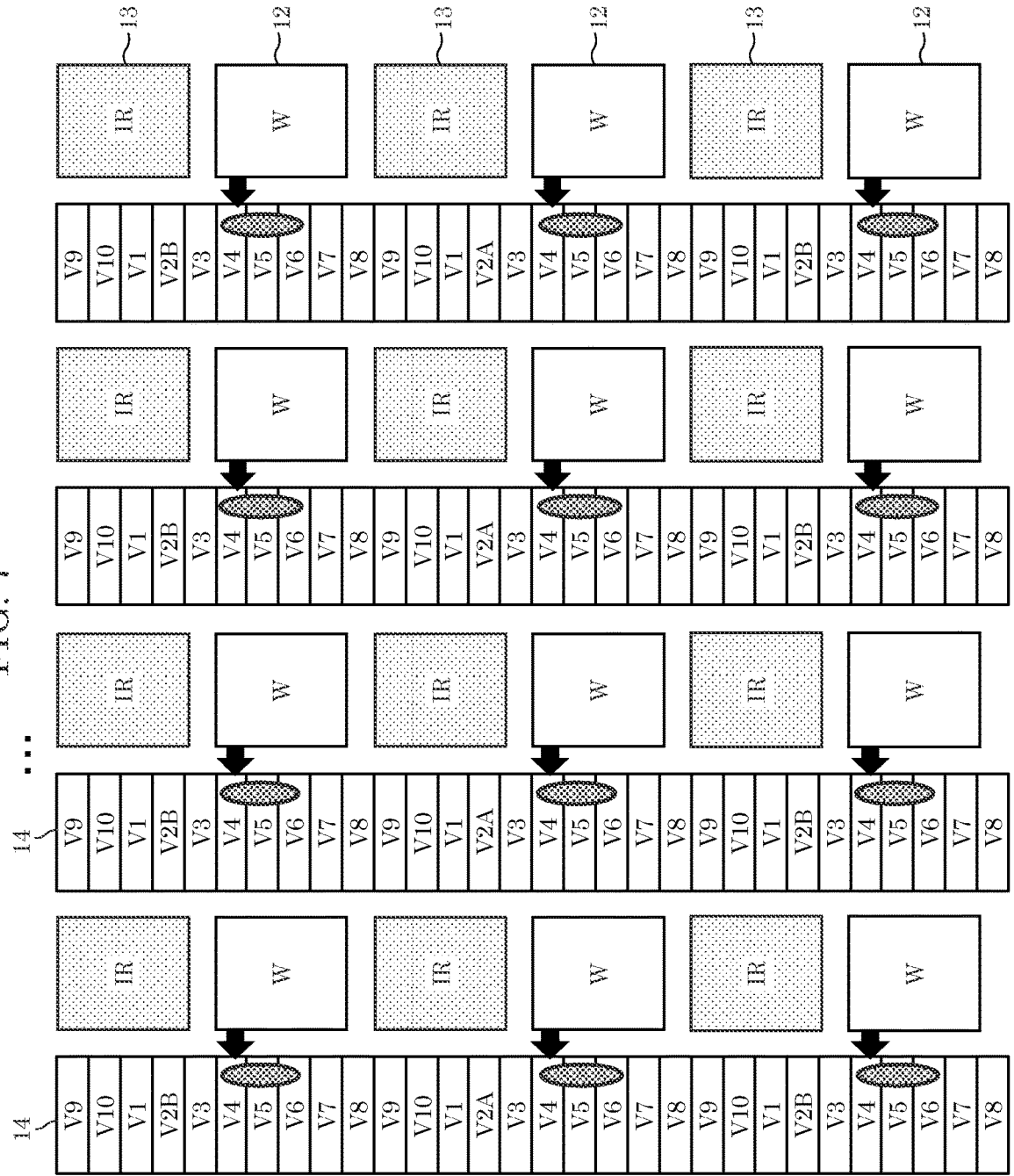
FIG. 7 is a diagram illustrating signal charge readout and charge accumulation from visible light pixels in the second readout example illustrated in FIG. 5.

FIG. 7 is a diagram illustrating signal charge readout and charge accumulation (packets) from visible light pixels 12 in the second readout example illustrated in FIG. 5.

Figure 8:
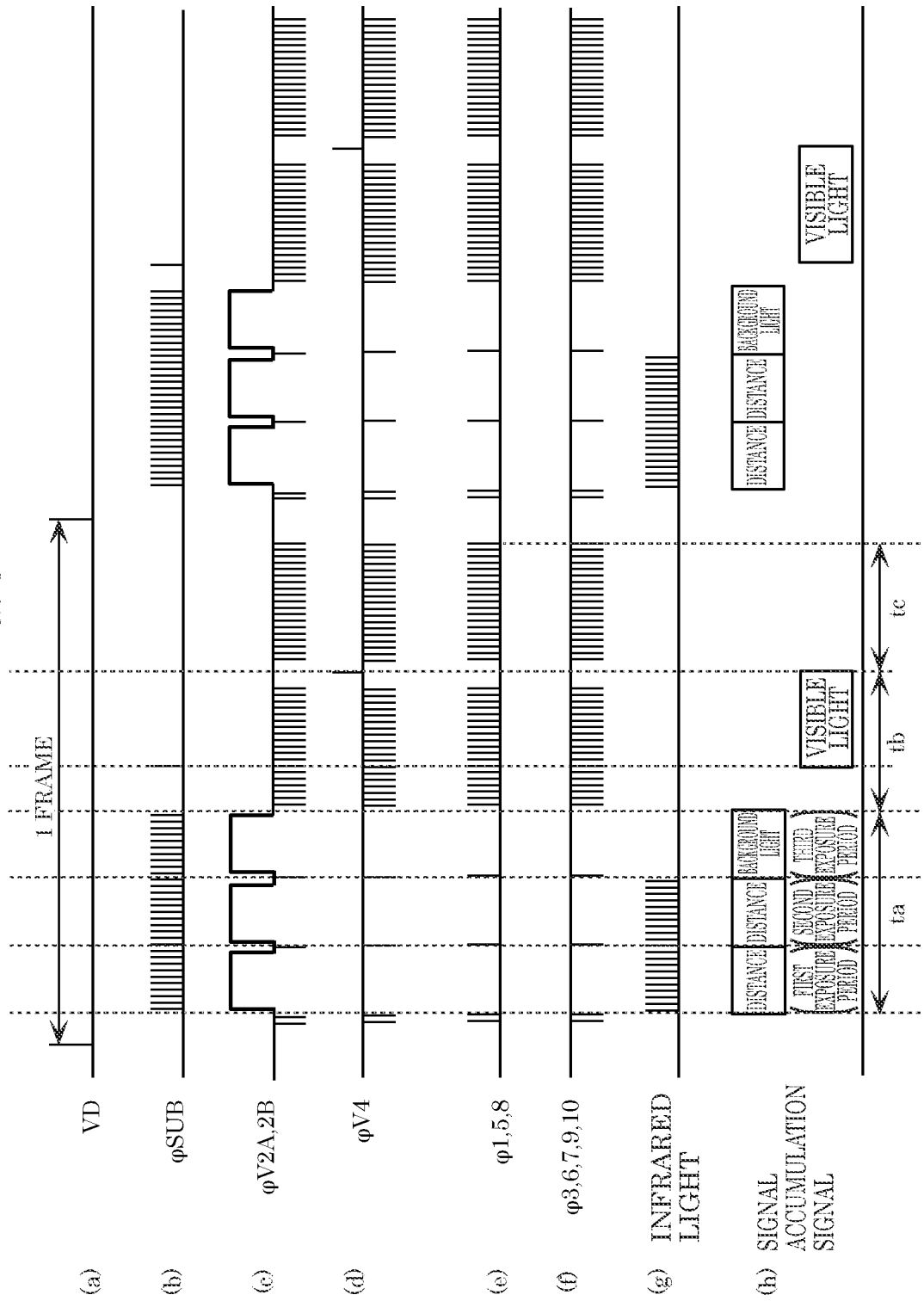
FIG. 8 is a diagram illustrating the drive timing of the solid-state imaging device in the second readout example illustrated in FIG. 5.

As illustrated in FIG. 7, regarding visible light pixels 12, signal charge readout from visible light pixels 12 to vertical transfer portions 14 and signal charge transfer in the column direction are performed in the same manner for all visible light pixels 12. Specifically, the signal charges generated in visible light pixels 12 are read out to the packets in vertical transfer portions 14 using readout electrodes V4 of vertical transfer portions 14. Subsequently, while remaining stored in the packets, the signal charges read out to vertical transfer portions 14 are transferred in the column direction and are then output to signal processing circuit 40 via horizontal transfer portion 15 and signal charge detector 16. FIG. 8 is a diagram illustrating the drive timing of solid-state imaging device 10 in the second readout example illustrated in FIG. 5. VD indicated in (a) in FIG. 8 represents the timing of a single frame, φSUB indicated in (b) in FIG. 8 represents the timing of substrate discharge pulses for discharging signal charges from all the pixels to a semiconductor substrate, φV2A, 2B indicated in (c) in FIG. 8 represent the timing of drive signals that are applied to readout electrodes V2A, V2B for infrared light pixels 13 in vertical transfer portions 14, φV4 indicated in (d) in FIG. 8 represents the timing of drive signals that are applied to readout electrodes V4 for visible light pixels 12 in vertical transfer portions 14, φV1, 5, 8 indicated in (e) in FIG. 8 represent the timing of drive signals that are applied to transfer electrodes V1, 5, 8 in vertical transfer portions 14, φV3, 6, 7, 9, 10 indicated in (f) in FIG. 8 represent the timing of drive signals that are applied to transfer electrodes V3, 6, 7, 9, 10 in vertical transfer portions 14, the infrared light indicated in (g) in FIG. 8 represents the timing of infrared light pulses emitted from light source unit 20, and the signal accumulation signal indicated in (h) in FIG. 8 represents exposure periods for visible light pixels 12 and infrared light pixels 13.

Note that as illustrated in FIG. 8, φV2A, 2B indicated in (c) in FIG. 8 and φV4 indicated in (d) in FIG. 8 represent pulses having three different voltage levels; at the highest voltage level, the signal charges are read out from infrared light pixels 13 and visible light pixels 12 to vertical transfer portions 14, and with pulses changing between the medium voltage level and the lowest voltage level, the signal charges in vertical transfer portions 14 are transferred in the column direction while remaining in the packets.

In period ta which is the first half of a single frame, a distance is measured by way of 2-pixel addition of infrared light pixels 13 using infrared light. Specifically, a distance is measured through infrared light emission and exposure in the first exposure period (readout of signal charge S0), a distance is measured through infrared light emission and exposure in the second exposure period (readout of signal charge S1), and exposure to background light is performed in the third exposure period (readout of signal charge BG) (refer to (h) in FIG. 8).

More specifically, in the first exposure period in period ta, first, substrate discharge pulses φSUB are applied ((b) in FIG. 8), thus signal charges in all the pixels are discharged to the substrate, thereafter infrared light pulse irradiation and exposure are performed at the timing indicated in the first exposure period in FIG. 4 ((g) in FIG. 8), signal charges are generated in infrared light pixels 13, and since φV2A, 2B have the highest voltage level ((c) in FIG. 8), the signal charges generated in infrared light pixels 13 are read out and added up in vertical transfer portions 14. Such application of substrate discharge pulses φSUB, infrared light pulse irradiation and exposure, and readout and addition of the signal charges from infrared light pixels 13 to vertical transfer portions 14 are repeated a predetermined number of times, and thus signal charges S0 generated in the first exposure period are read out.

Also in the second exposure period and the third exposure period in period ta, basically the same operations as that in the first exposure period are performed, and signal charges S1, BG generated in the second exposure period and the third exposure period are read out. Note that in the second exposure period, the infrared light pulse irradiation and the exposure are performed at the timing indicated in the second exposure period in FIG. 4. Furthermore, in the third exposure period, no infrared light irradiation is performed.

In subsequent period tb, signal charges S0, S1, BG read out from infrared light pixels 13 to vertical transfer portions 14 are transferred in the column direction while remaining stored in the packets (refer to (c), (d), (e), and (f) in FIG. 8) and are then output to signal processing circuit 40 via horizontal transfer portion 15 and signal charge detector 16. Signal processing circuit 40 generates a distance image from read-out signal charges S0, S1, BG according to the principle indicated in FIG. 4. Furthermore, from the middle of period tb, in parallel with the above transfer, exposure to visible light is performed, and signal charges are generated in visible light pixels 12 (refer to (h) in FIG. 8).

Subsequently, in period tc, first, the signal charges generated in visible light pixels 12 are read out to vertical transfer portions 14 ((d) in FIG. 8), thereafter the signal charges read out to vertical transfer portions 14 are transferred in the column direction while remaining stored in the packets (refer to (c), (d), (e), and (f) in FIG. 8), and are then output to signal processing circuit 40 via horizontal transfer portion 15 and signal charge detector 16. Signal processing circuit 40 generates a visible image from the read-out signal charges.

As described above, solid-state imaging device 10 according to the present embodiment includes imager 11 including a plurality of pixels arranged in rows and columns. Imager 11 is formed by alternately disposing, in the column direction, a first row in which visible light pixels 12 each including a first photoelectric converter that converts visible light into a signal charge are arranged adjacent to each other in the row direction; and a second row in which infrared light pixels 13 each including a second photoelectric converter that converts infrared light into a signal charge are arranged adjacent to each other in the row direction.

Thus, imager 11 includes visible light pixels 12 and infrared light pixels 13, making it possible to generate a visible image and a distance image. Furthermore, since infrared light pixels 13 are arranged adjacent to one another in the row direction in the second row of imager 11, it is possible to generate a distance image with high sensitivity by adding signal charges from two adjacent infrared light pixels 13 upon readout. This results in solid-state imaging device 10 which generates a distance image and a visible image and is suited to generate the distance image with high sensitivity.

Solid-state imaging device 10 further includes a plurality of vertical transfer portions 14 provided in one-to-one correspondence with the columns of the plurality of pixels and including: readout electrodes which read out the signal charges generated in the plurality of pixels; and transfer electrodes which transfer the read-out signal charges in the column direction. In the second readout example illustrated in FIG. 5 to FIG. 8, vertical transfer portion 14 reads out, using readout electrodes V2A, V2B, signal charges generated in two infrared light pixels 13 adjacent to each other in the second row, to sections of the vertical transfer portion 14 that are located in identical positions in the column direction, and adds up the signal charges.

Thus, the signal charges generated in two infrared light pixels 13 adjacent to each other in the second row are read out to sections of vertical transfer portion 14 that are located in identical positions in the column direction, and are added up; therefore, a distance image is generated with high sensitivity.

Furthermore, distance-measuring imaging device 5 according to the present embodiment includes: light source unit 20 which emits infrared light; solid-state imaging device 10; control circuit 30 which controls light source unit 20 and solid-state imaging device 10 to cause visible light pixel 12 included in solid-state imaging device 10 to receive visible light and cause infrared light pixel 13 included in solid-state imaging device 10 to receive reflected light obtained by reflecting, by a subject, the infrared light emitted by light source unit 20; and signal processing circuit 40 which generates a visible image of the subject by reading out signal charges generated in visible light pixels 12 included in solid-state imaging device 10 and generates a distance image indicating the distance to the subject by reading out signal charges generated in infrared light pixels 13 included in solid-state imaging device 10.

Thus, since solid-state imaging device 10 includes visible light pixels 12 and infrared light pixels 13, signal processing circuit 40 generates a visible image and a distance image. Furthermore, since infrared light pixels 13 are arranged adjacent to one another in the row direction in solid-state imaging device 10, a distance image is generated with high sensitivity by adding signal charges from two adjacent infrared light pixels 13 upon readout. This results in distance-measuring imaging device 5 which generates a distance image and a visible image and is suited to generate the distance image with high sensitivity.

Note that signal processing circuit 40 may generate not only a distance image, but also an infrared light image, by reading out signal charges generated in infrared light pixels 13 included in solid-state imaging device 10.

Third Readout Example

Figure 9:
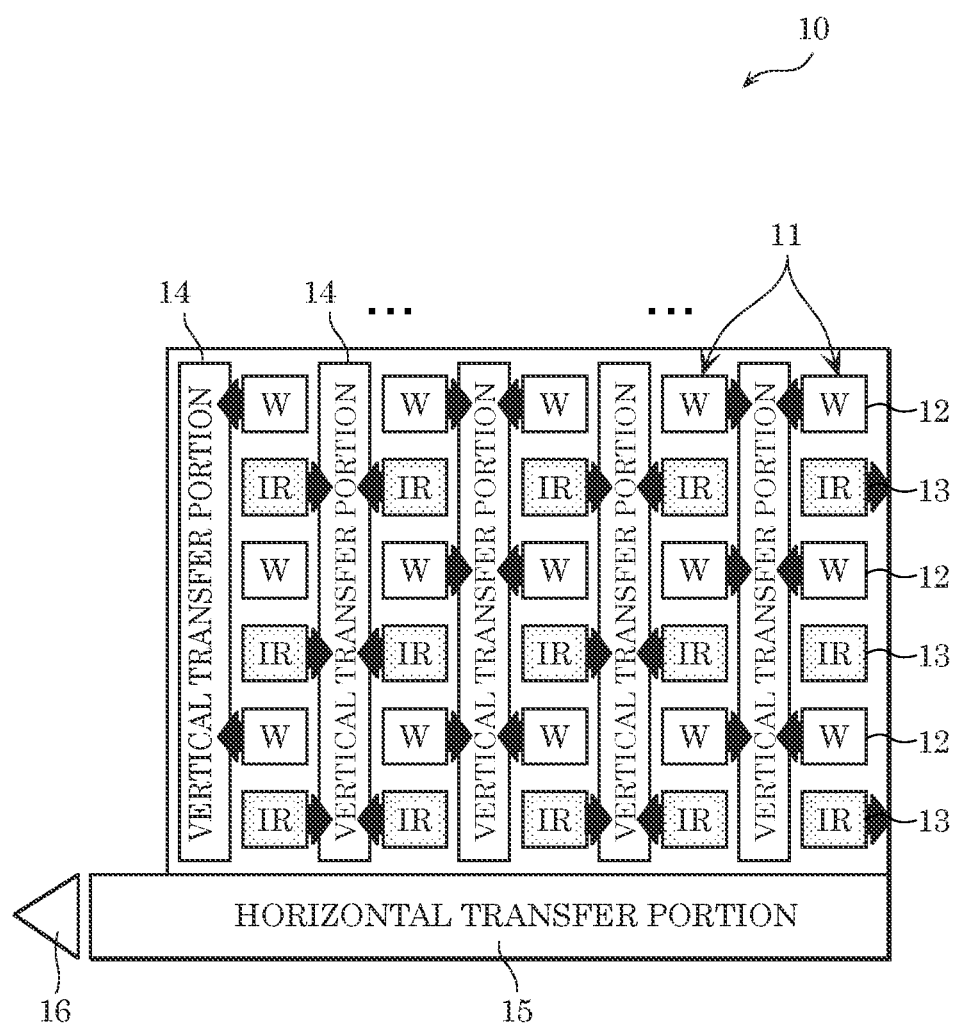
FIG. 9 is a diagram illustrating a third example of reading out signal charges by the solid-state imaging device illustrated in FIG. 1.

FIG. 9 is a diagram illustrating the third example of reading out signal charges by solid-state imaging device 10 illustrated in FIG. 1.

In this example, not only for infrared light pixels 13, but also for visible light pixels 12, vertical transfer portion 14 reads out, using the readout electrodes, signal charges generated in two adjacent visible light pixels 12, to sections (packets) of vertical transfer portion 14 that are located in identical positions in the column direction, and adds up the signal charges.

At this time, vertical transfer portion 14 in one of the even-numbered column and the odd-numbered column among the plurality of vertical transfer portions 14 reads out, using readout electrode V4, signal charges generated in two visible light pixels 12 adjacent to each other in the first row, to sections of the vertical transfer portion 14 that are located in identical positions in the column direction, and adds up the signal charges, and vertical transfer portion 14 in the other of the even-numbered column and the odd-numbered column among the plurality of vertical transfer portions 14 reads out, using readout electrodes V2A, 2B, signal charges generated in two infrared light pixels 13 adjacent to each other in the second row, to sections of the vertical transfer portion 14 that are located in identical positions in the column direction, and adds up the signal charges. In other words, vertical transfer portion 14 which transfers, in the column direction, the signal charges generated in visible light pixels 12 and vertical transfer portion 14 which transfers, in the column direction, the signal charges generated in infrared light pixels 13 are different (separated as one and the other of the even-numbered column and the odd-numbered column).

Figure 10:
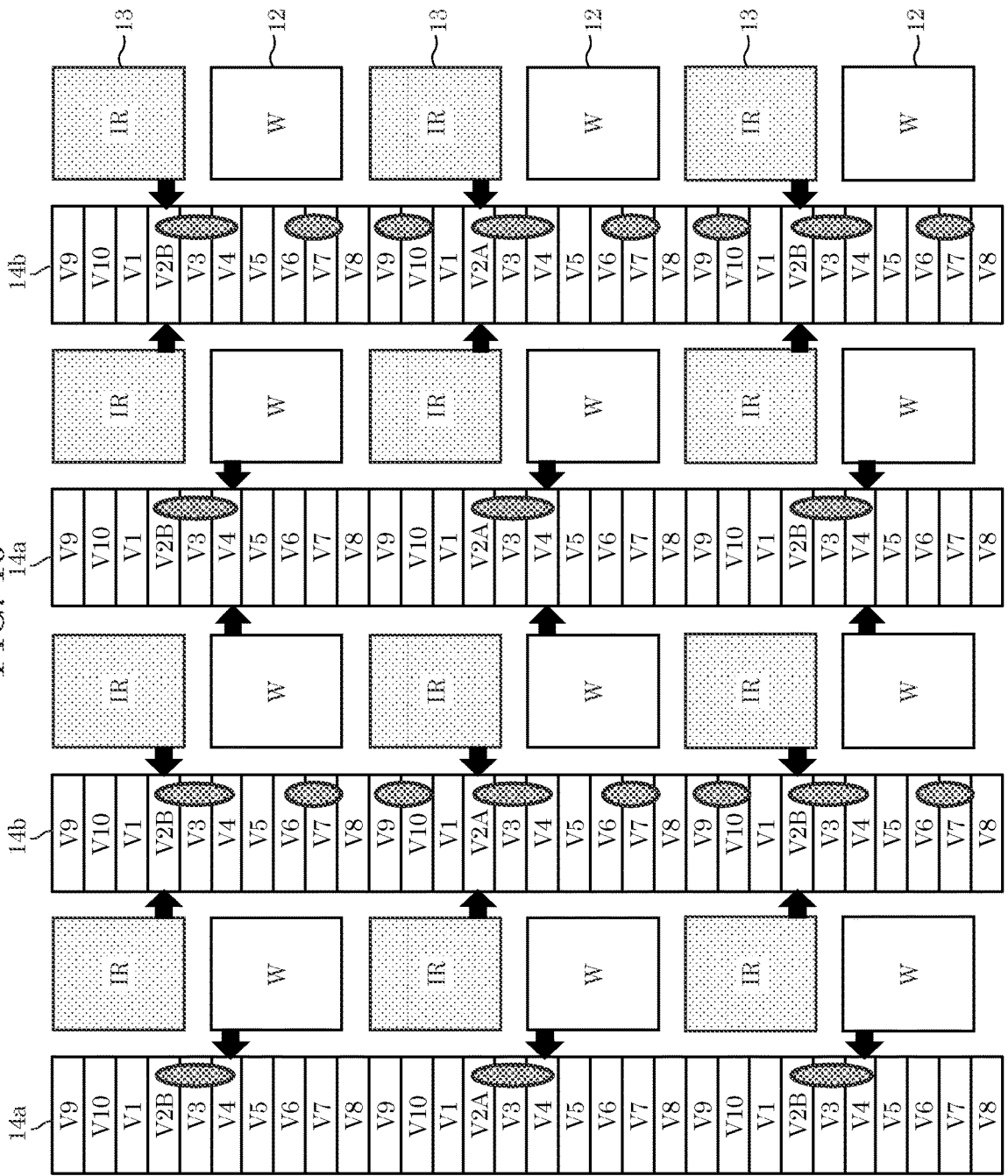
FIG. 10 is a diagram illustrating signal charge readout and charge accumulation from visible light pixels and infrared light pixels in the third readout example illustrated in FIG. 9.

FIG. 10 is a diagram illustrating signal charge readout and charge accumulation (packets) from visible light pixels 12 and infrared light pixels 13 in the third readout example illustrated in FIG. 9.

Vertical transfer portion 14a in the odd-numbered column reads out, using readout electrode V4, signal charges from two visible light pixels 12 adjacent to each other in the row direction, to the same packet of vertical transfer portion 14, adds up the signal charges, and subsequently transfers the packet in the column direction using transfer electrodes V1 to V10.

Meanwhile, vertical transfer portion 14b in the even-numbered column repeatedly performs, in first exposure period T1, second exposure period T2, and third exposure period T3, the operation of reading out, using readout electrodes V2A, V2B, signal charges from two infrared light pixels 13 adjacent to each other in the row direction, to the same packet of vertical transfer portion 14, and adding up the signal charges, and subsequently transfers the packet in the column direction using transfer electrodes V1 to V10.

Figure 11:
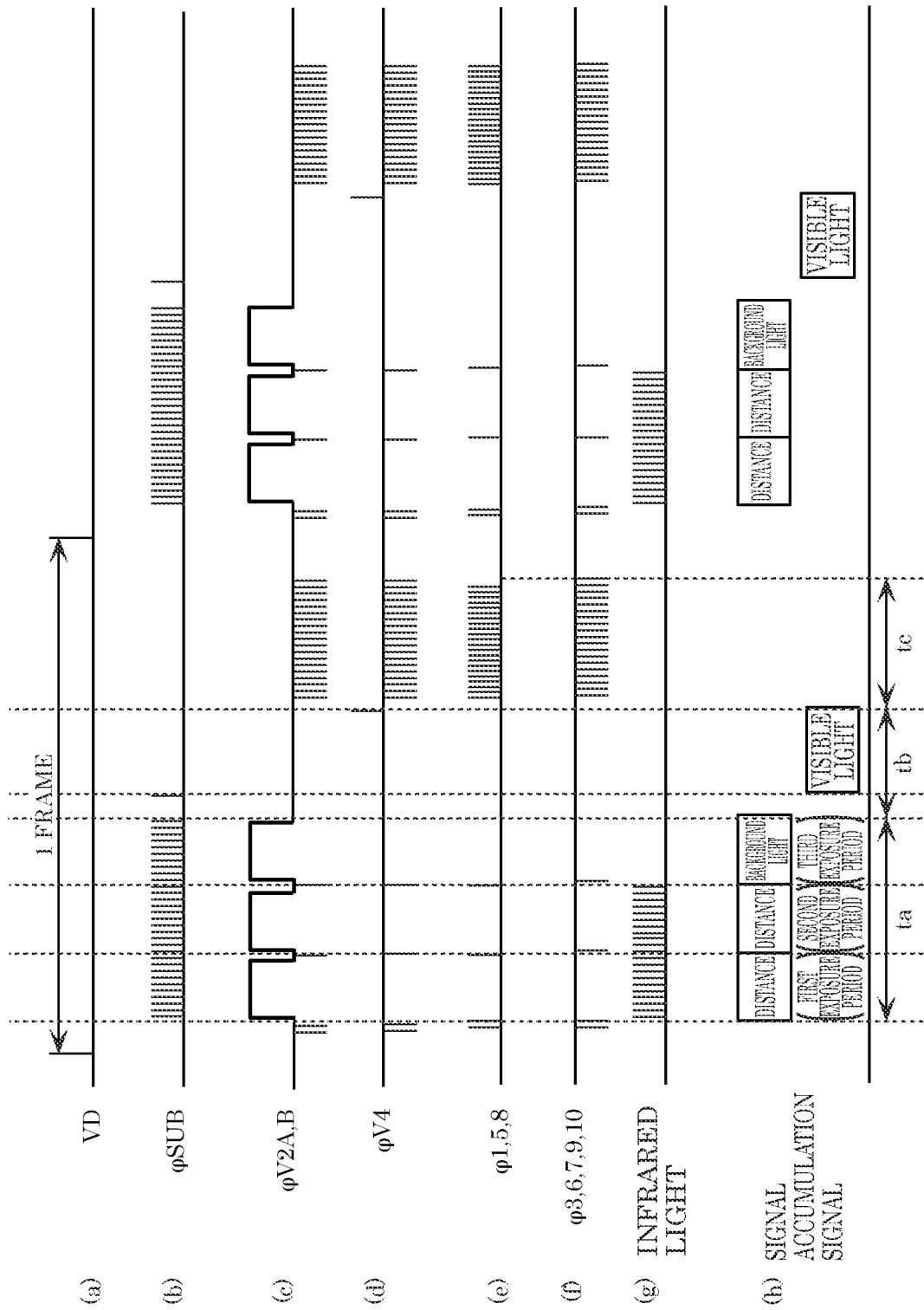
FIG. 11 is a diagram illustrating one example of the drive timing of the solid-state imaging device in the third readout example illustrated in FIG. 9.

FIG. 11 is a diagram illustrating one example of the drive timing of solid-state imaging device 10 in the third readout example illustrated in FIG. 9. The items indicated in (a) to (h) in FIG. 11 are the same as those in FIG. 8.

In period ta which is the first half of a single frame, the same operation as that in FIG. 8 is performed.

In subsequent period tb, unlike FIG. 8, only exposure to visible light is performed, and thus signal charges are generated in visible light pixels 12 (refer to (h) in FIG. 11). In other words, in this period tb, signal charges S0, S1, BG read out from infrared light pixels 13 to vertical transfer portions 14 are not transferred in the column direction (in subsequent period tc, these are transferred in the column direction). Therefore, as compared to the case in FIG. 8, period tb is shorter, and it is possible to capture an image at a higher frame rate.

Subsequently, in period tc, first, the signal charges generated in visible light pixels 12 are read out to vertical transfer portions 14 ((d) in FIG. 11), thereafter the signal charges read out from visible light pixels 12 to vertical transfer portion 14a in the odd-numbered column and signal charges S0, S1, BG read out from infrared light pixels 13 to vertical transfer portion 14b in the even-numbered column are transferred in the column direction while remaining stored in the packets (refer to (c), (d), (e), and (f) in FIG. 11), and are then output to signal processing circuit 40 via horizontal transfer portion 15 and signal charge detector 16.

Figure 12:
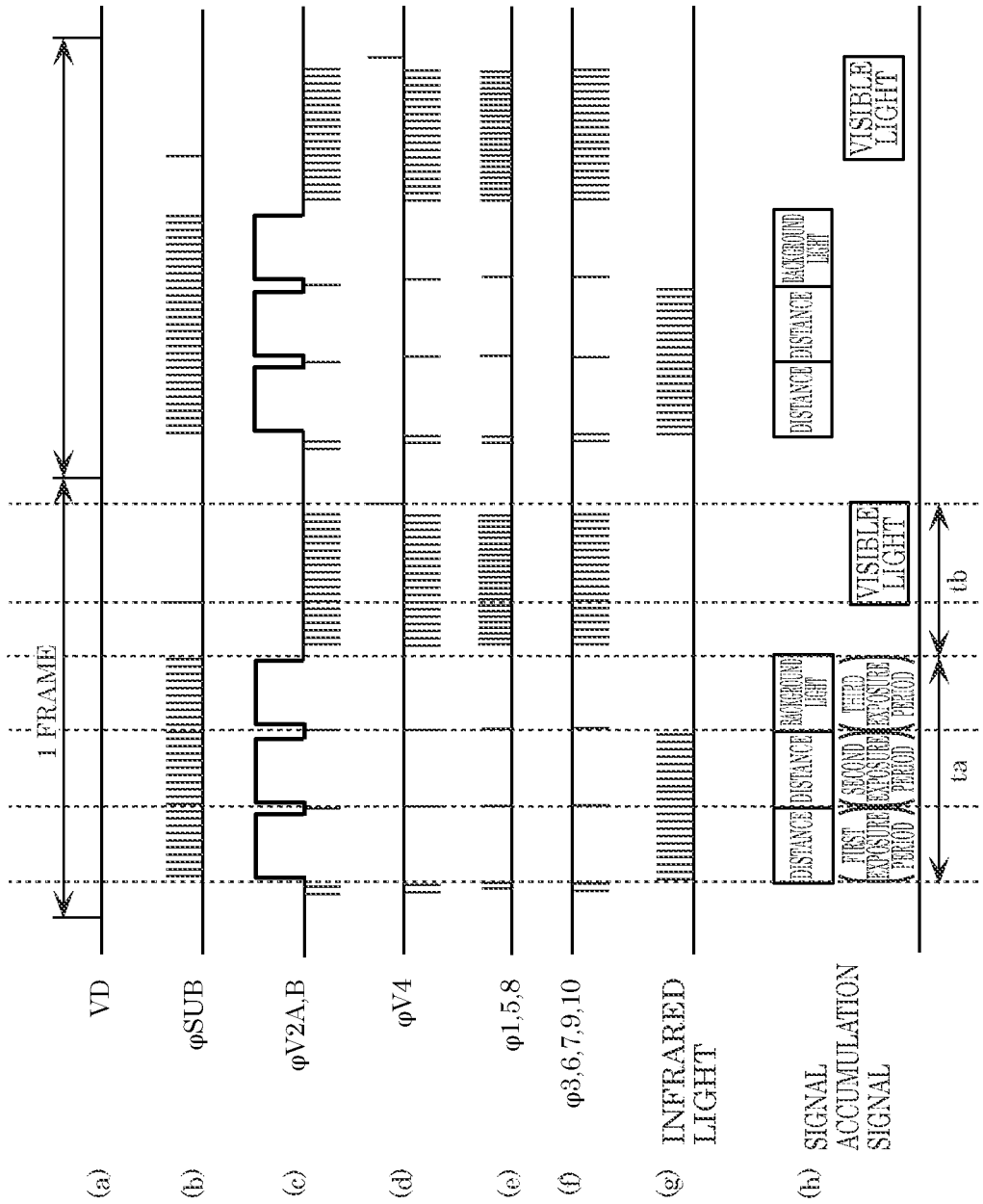
FIG. 12 is a diagram illustrating another example of the drive timing of the solid-state imaging device in the third readout example illustrated in FIG. 9.

FIG. 12 is a diagram illustrating another example of the drive timing of solid-state imaging device 10 in the third readout example illustrated in FIG. 9. The items indicated in (a) to (h) in FIG. 12 are the same as those in FIG. 11.

In period ta which is the first half of a single frame, the same operation as that in FIG. 11 is performed.

In subsequent period tb, unlike FIG. 11, the signal charges read out to vertical transfer portion 14a in the odd-numbered column as a result of exposure to visible light and readout from visible light pixels 12 in the immediately preceding frame and signal charges S0, S1, BG read out to vertical transfer portion 14b in the even-numbered column as a result of exposure and readout from infrared light pixels 13 in immediately preceding period ta are transferred in the column direction while remaining stored in the packets (refer to (c), (d), (e), and (f) in FIG. 12), and are then output to signal processing circuit 40 via horizontal transfer portion 15 and signal charge detector 16.

Furthermore, from the middle of period tb, in parallel with the above transfer, application of substrate discharge pulses φSUB ((b) in FIG. 11), exposure to visible light ((h) in FIG. 12), and readout and addition of signal charges from visible light pixels 12 to vertical transfer portion 14a in the odd-numbered column according to φV4 ((d) in FIG. 8) are performed, which are preparation for transfer in vertical transfer portions 14 in the column direction in the next frame.

At the drive timing indicated in FIG. 12, as compared to FIG. 11, the processes in period tb and period tc in FIG. 11 are combined as one period tb, and thus it is possible to capture an image at a higher frame rate.

Note that also in the third readout example, signal processing circuit 40 generates a distance image from read-out signal charges S0, S1, BG according to the principle indicated in FIG. 4.

As described above, in the third readout example illustrated in FIG. 9 to FIG. 12, not only for infrared light pixels 13, but also for visible light pixels 12, vertical transfer portion 14 reads out, using readout electrodes V4, signal charges generated in two visible light pixels 12 adjacent to each other in the first row, to sections of the vertical transfer portion 14 that are located in identical positions in the column direction, and adds up the signal charges.

Thus, the signal charges generated in two visible light pixels 12 adjacent to each other in the first row are read out to sections of vertical transfer portion 14 that are located in identical positions in the column direction, and are added up; therefore, the sensitivity for a visible image increases to twice as high as that in the case where signal charges are read out from visible light pixels 12 separately.

Furthermore, vertical transfer portion 14 in one of the even-numbered column and the odd-numbered column among the plurality of vertical transfer portions 14 reads out, using readout electrode V4, signal charges generated in two visible light pixels 12 adjacent to each other in the first row, to the sections of vertical transfer portion 14 that are located in identical positions in the column direction, and adds up the signal charges, and vertical transfer portion 14 in the other of the even-numbered column and the odd-numbered column among the plurality of vertical transfer portions 14 reads out, using readout electrodes V2A, V2B, signal charges generated in two infrared light pixels 13 adjacent to each other in the second row, to sections of the vertical transfer portion 14 that are located in identical positions in the column direction, and adds up the signal charges.

Thus, vertical transfer portion 14a which transfers, in the column direction, the signal charges generated in visible light pixels 12 and vertical transfer portion 14b which transfers, in the column direction, the signal charges generated in infrared light pixels 13 are different; therefore, the signal charges generated in visible light pixels 12 and infrared light pixels 13 can be transferred in the column direction at the same time, resulting in a shorter charge transfer period and a higher frame rate.

Fourth Readout Example

Figure 13:
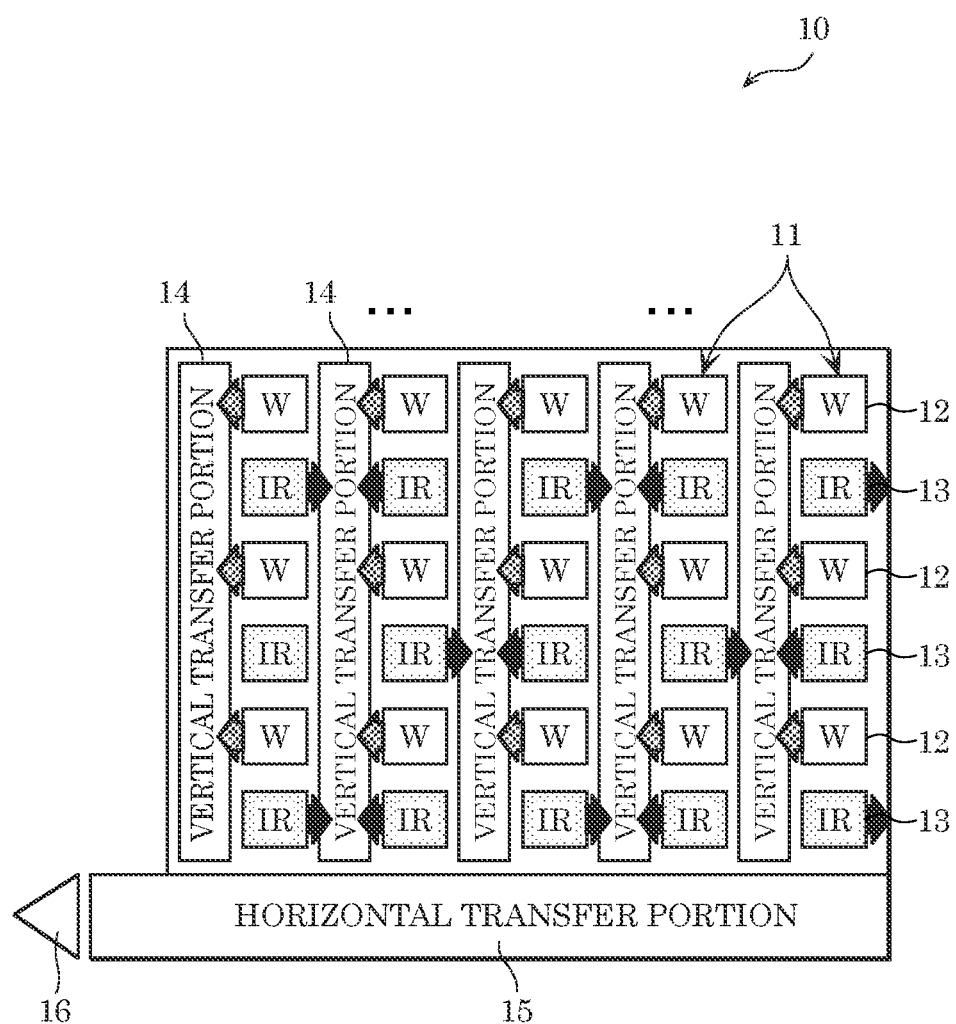
FIG. 13 is a diagram illustrating a fourth example of reading out signal charges by the solid-state imaging device illustrated in FIG. 1.

FIG. 13 is a diagram illustrating the fourth example of reading out signal charges by solid-state imaging device 10 illustrated in FIG. 1.

In this example, as in the second readout example illustrated in FIG. 5, vertical transfer portion 14 reads out, using the readout electrodes, signal charges from visible light pixels 12 separately, but, for infrared light pixels 13, reads out signal charges generated in two infrared light pixels 13 adjacent to each other in the second row (that is, in the row direction), to sections (packets) of vertical transfer portion 14 that are located in identical positions in the column direction, and adds up the signal charges.

Note that in the fourth readout example, as exposure to infrared light pixels 13, two types of exposure having different time lengths (hereinafter, exposure for a longer time will be referred to as "long exposure" and exposure for a shorter time will be referred to as "short exposure") are performed.

Figure 14:
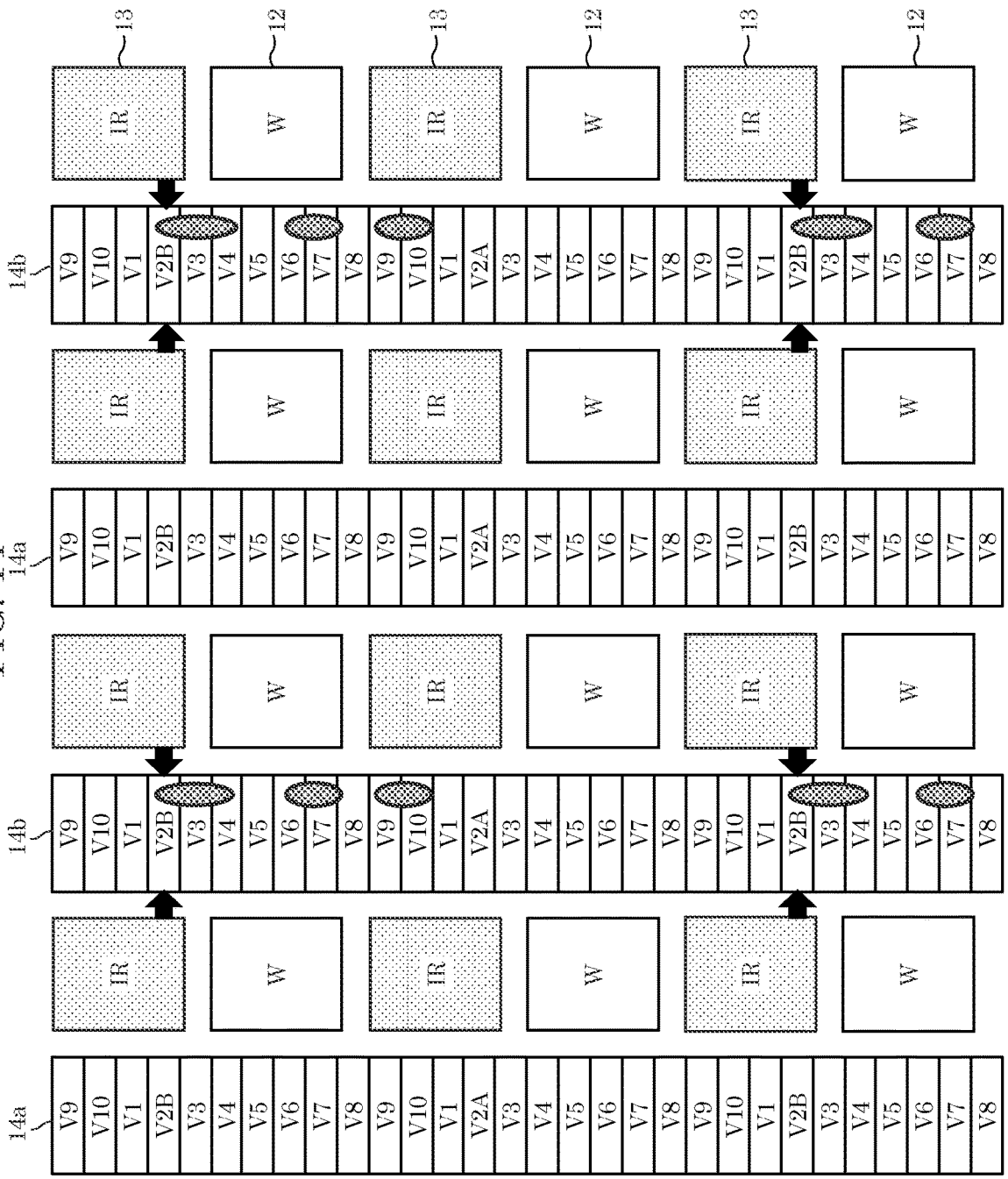
FIG. 14 is a diagram illustrating signal charge readout and charge accumulation from infrared light pixels during long exposure in the fourth readout example illustrated in FIG. 13.

FIG. 14 is a diagram illustrating signal charge readout and charge accumulation (packets) from infrared light pixels 13 during the long exposure in the fourth readout example illustrated in FIG. 13.

During the long exposure, in alternate rows (in this example, the odd-numbered rows of only the second rows) among the second rows in each of which infrared light pixels 13 are arranged, signal charges generated in two adjacent infrared light pixels 13 are read out using readout electrode V2B to sections (packets) of vertical transfer portion 14b in the even-numbered column that are located in identical positions in the column direction, and are added up. Each of signal charges S0, S1, BG generated in first exposure period T1, second exposure period T2, and third exposure period T3 is read out in this way.

Figure 15:
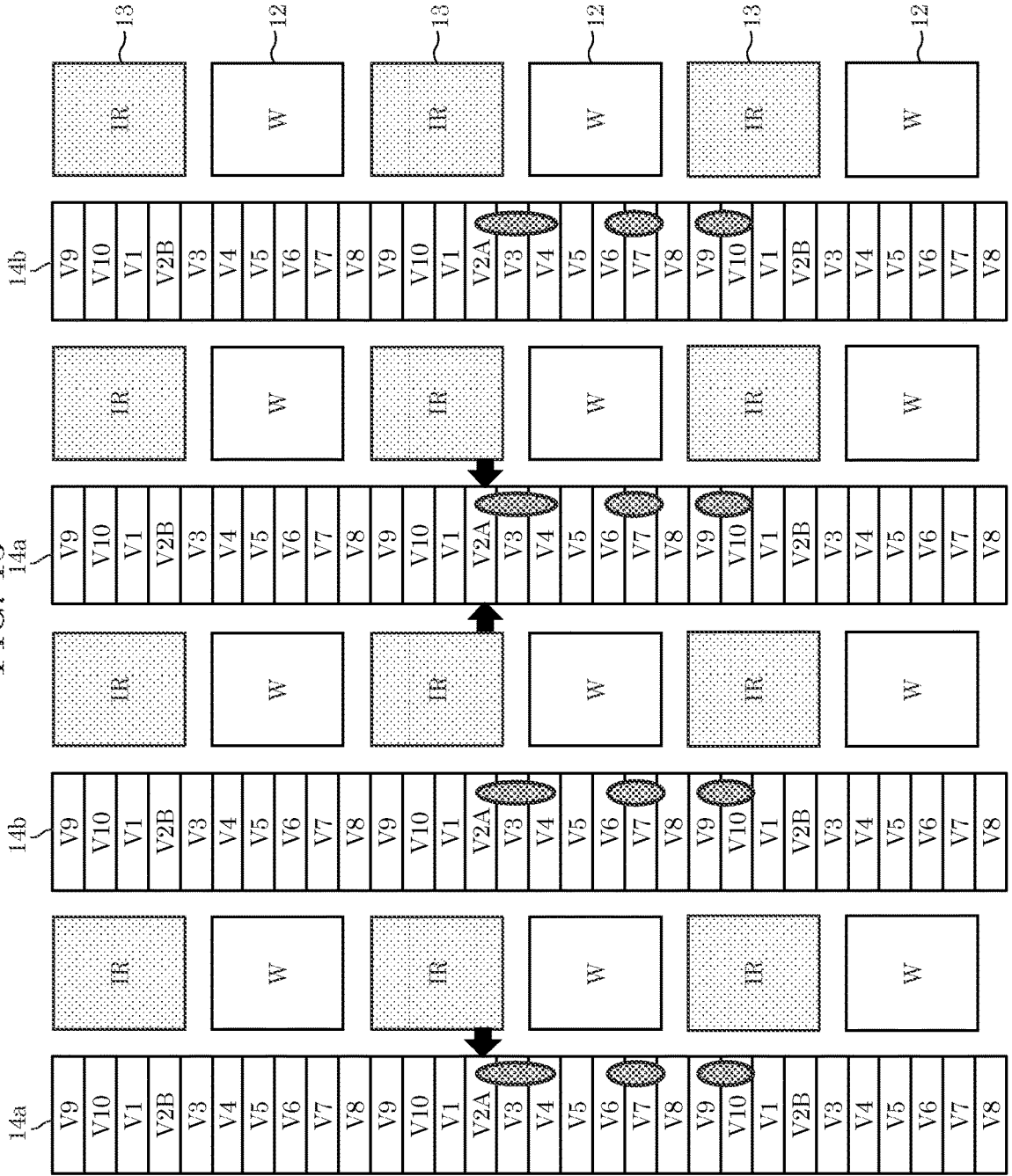
FIG. 15 is a diagram illustrating signal charge readout and charge accumulation from infrared light pixels during short exposure in the fourth readout example illustrated in FIG. 13.

FIG. 15 is a diagram illustrating signal charge readout and charge accumulation (packets) from infrared light pixels 13 during the short exposure in the fourth readout example illustrated in FIG. 13.

During the short exposure, in alternate rows (in this example, the even-numbered rows of only the second rows) among the second rows in each of which infrared light pixels 13 are arranged, signal charges generated in two adjacent infrared light pixels 13 are read out using readout electrode V2A to sections (packets) of vertical transfer portion 14a in the odd-numbered column that are located in identical positions in the column direction, and are added up. Each of signal charges S0, S1, BG generated in first exposure period T1, second exposure period T2, and third exposure period T3 is read out in this way.

In the readout example illustrated in the drawings, vertical transfer portion 14b in the even-numbered column operates so that column-wise sections (packets) of vertical transfer portion 14a in the odd-numbered column to which signal charges S0, S1, BG resulting from the short exposure are read out and column-wise sections (packets) of vertical transfer portion 14b in the even-numbered column in which signal charges S0, S1, BG resulting from the long exposure are stored are aligned in the row direction. Specifically, vertical transfer portion 14b in the even-numbered column reads out signal charges S0, S1, BG resulting from the long exposure, to respective packets, and then transfers these packets in the column direction (downward or upward) by two pixels, and subsequently, vertical transfer portion 14a in the odd-numbered column reads out signal charges S0, S1, BG resulting from the short exposure, to respective packets.

This is for shortening the period in which vertical transfer portion 14 transfers charges in the column direction by aligning, in the row direction, the position of a packet in which signal charges S0, S1, BG resulting from the long exposure are stored and the position of a packet in which signal charges S0, S1, BG resulting from the short exposure are stored.

Figure 16:
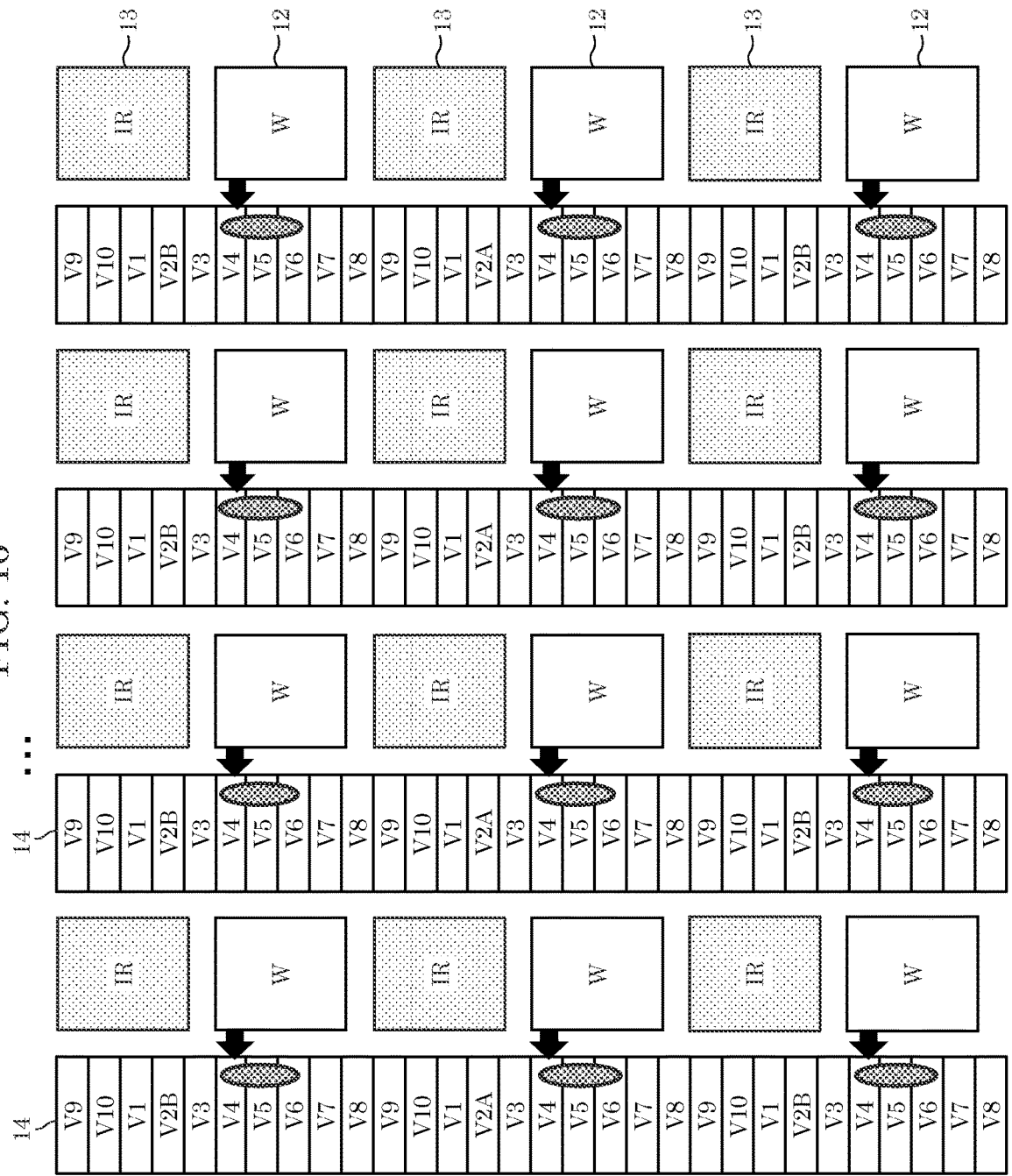
FIG. 16 is a diagram illustrating signal charge readout and charge accumulation from visible light pixels in the fourth readout example illustrated in FIG. 13.

FIG. 16 is a diagram illustrating signal charge readout and charge accumulation (packets) from visible light pixels 12 in the fourth readout example illustrated in FIG. 13.

As in the operation illustrated in FIG. 7, the signal charge generated in each visible light pixel 12 is read out to a packet in vertical transfer portion 14 using readout electrode V4 of vertical transfer portion 14, is transferred in the column direction while remaining stored in the packet, and is output to signal processing circuit 40 via horizontal transfer portion 15 and signal charge detector 16.

Figure 17:
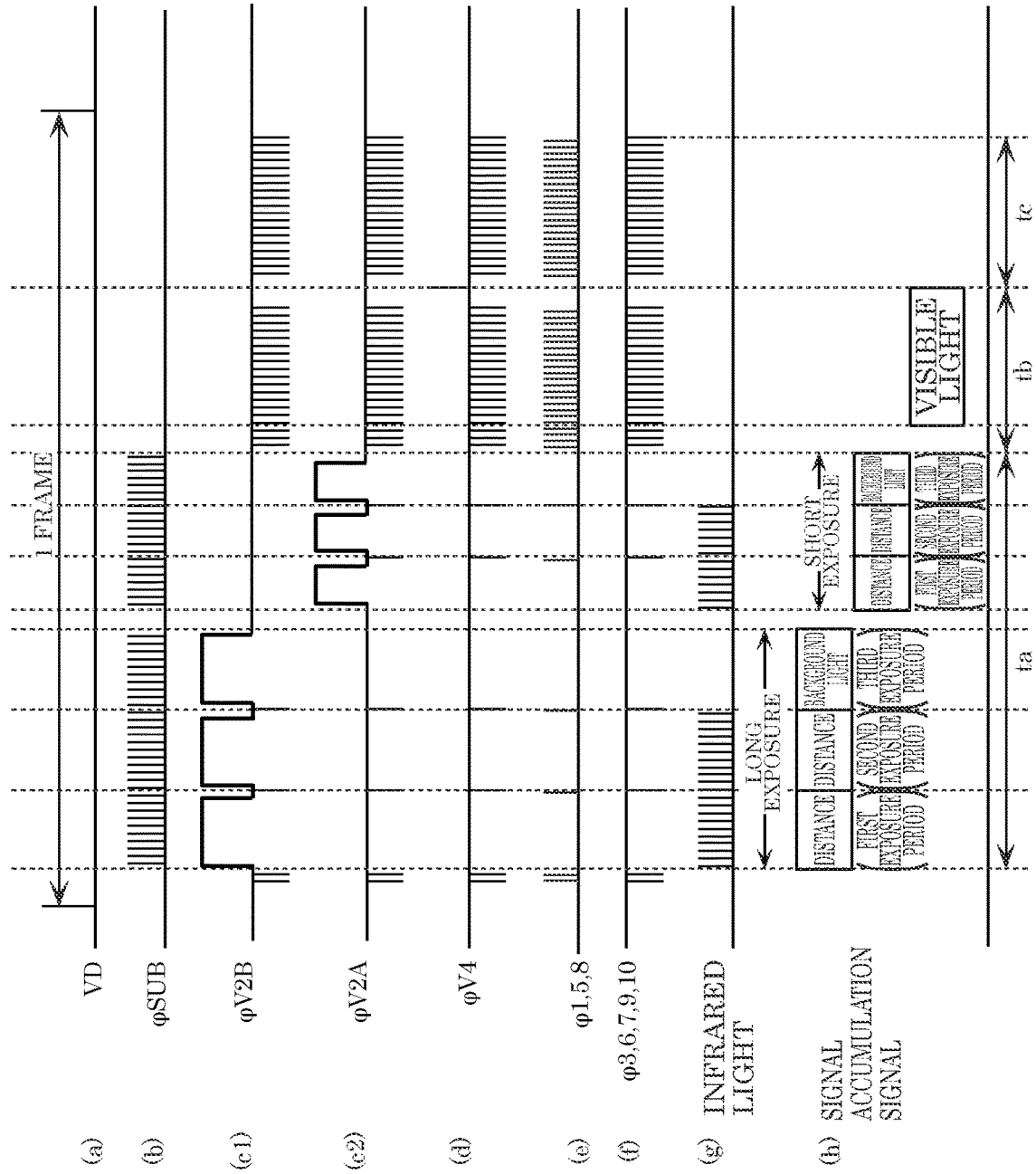
FIG. 17 is a diagram illustrating one example of the drive timing of the solid-state imaging device in the fourth readout example illustrated in FIG. 13.

FIG. 17 is a diagram illustrating one example of the drive timing of solid-state imaging device 10 in the fourth readout example illustrated in FIG. 13. Here is shown the drive timing in the case of not performing the process such as that illustrated in FIG. 15 of aligning, in the row direction, the position of a packet in which signal charges S0, S1, BG resulting from the long exposure are stored and the position of a packet in which signal charges S0, S1, BG resulting from the short exposure are stored (in other words, the case where the signal charges resulting from the long exposure and the signal charges resulting from the short exposure are stored in packets in different rows). The items indicated in (a) to (h) in FIG. 17 are basically the same as those in FIG. 8. Note that in FIG. 17, φV2A, 2B indicated in (c) in FIG. 8 is indicated in separate forms (in FIG. 17, (c1) represents φV2B and (c2) represents φV2A).

In period ta which is the first half of a single frame, the long exposure is performed so that a distance is measured through infrared light emission and exposure in the first exposure period (readout of signal charge S0), a distance is measured through infrared light emission and exposure in the second exposure period (readout of signal charge S1), and exposure to background light is performed in the third exposure period (readout of signal charge BG), and subsequently, the short exposure is performed so that a distance is measured through infrared light emission and exposure in the first exposure period (readout of signal charge S0), a distance is measured through infrared light emission an exposure in the second exposure period (readout of signal charge S1), and exposure to background light is performed in the third exposure period (readout of signal charge BG) (refer to (h) in FIG. 17). Note that the ratio of the length of exposure time set in the first exposure period, the second exposure period, and the third exposure period between the long exposure and the short exposure is, for example, 8:1.

In subsequent period tb and period tc, substantially the same operations as that in FIG. 8 are performed.

Note that in consideration of the ratio of exposure time between the long exposure and the short exposure, signal processing circuit 40 that has received RAW data resulting from these long exposure and short exposure calculates a distance by the TOF method illustrated in FIG. 4, using signal charges S0, S1, BG generated through each exposure, and thus calculates the distance to a subject on a per pixel basis (in other words, generates a distance image) in a wide dynamic range.

Figure 18:
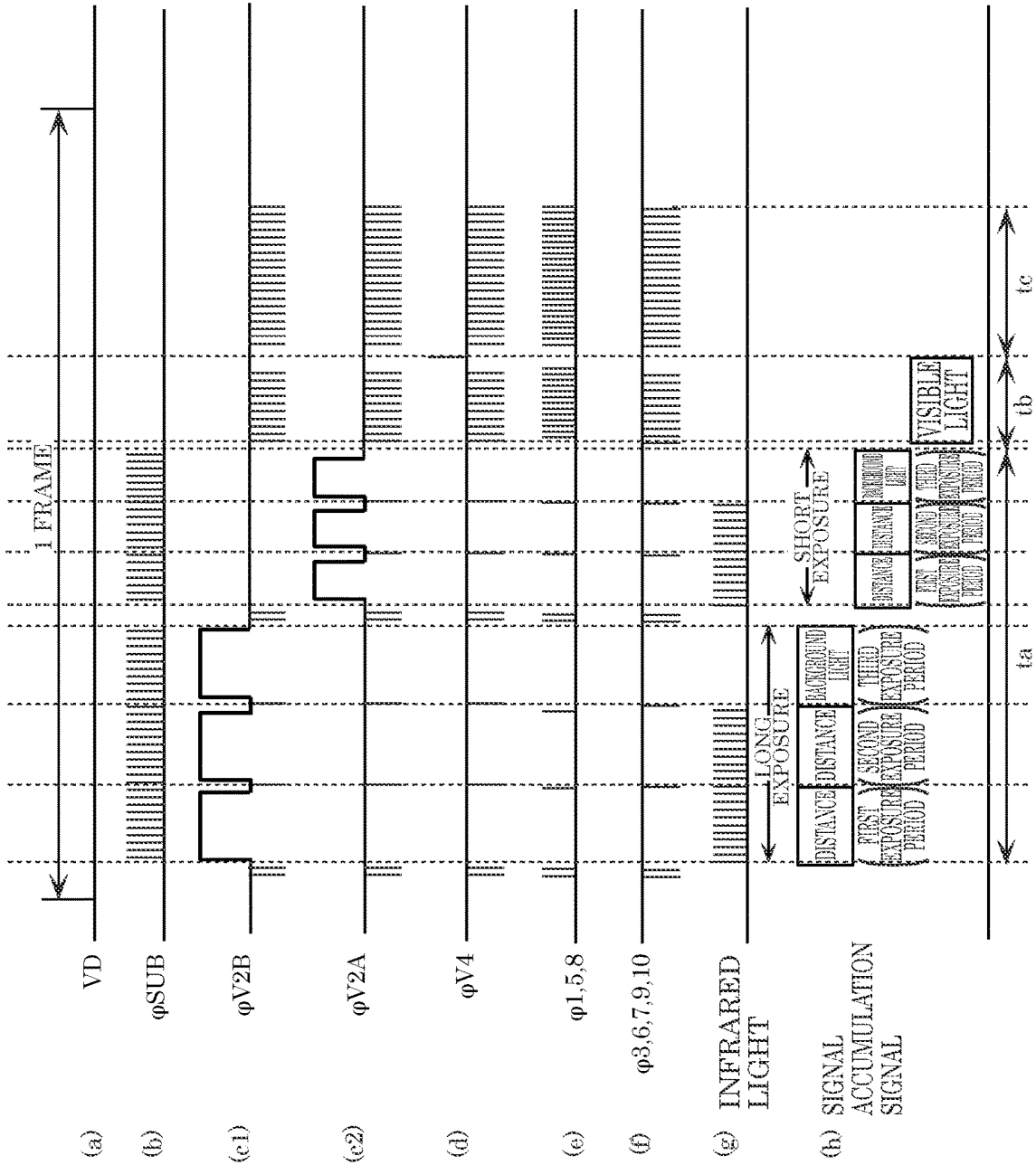
FIG. 18 is a diagram illustrating another example of the drive timing of the solid-state imaging device in the fourth readout example illustrated in FIG. 13.

FIG. 18 is a diagram illustrating another example of the drive timing of solid-state imaging device 10 in the fourth readout example illustrated in FIG. 13. Here is shown the drive timing in the case of performing the process such as that illustrated in FIG. 15 of aligning, in the row direction, the position of a packet in which signal charges S0, S1, BG resulting from the long exposure are stored and the position of a packet in which signal charges S0, S1, BG resulting from the short exposure are stored (in other words, the case where the signal charges resulting from the long exposure and the signal charges resulting from the short exposure are stored in packets in the same row). The items indicated in (a) to (h) in FIG. 18 are the same as those in FIG. 17.

The basic operation is the same as that illustrated in FIG. 17, but the charge transfer period (period tb) for signal charges read from infrared light pixels 13 is shorter than that in FIG. 17. According to this drive timing, the position of a packet in which signal charges S0, S1, BG resulting from the long exposure and the position of a packet in which signal charges S0, S1, BG resulting from the short exposure are aligned in the row direction, meaning that there are a large number of sections in vertical transfer portion 14 where no packets are present; thus, for the sections, the transfer of signal charges from vertical transfer portion 14 to horizontal transfer portion 15 can be omitted, leading to a reduction in the charge transfer period in which vertical transfer portion 14 transfers signal charges in the column direction.

As described above, according to the fourth readout example illustrated in FIG. 13 to FIG. 18, vertical transfer portion 14 in one of the even-numbered column and the odd-numbered column among the plurality of vertical transfer portions 14 reads out, using readout electrode V2B, signal charges generated in infrared light pixels 13 included in a part of the plurality of second rows through exposure at the first exposure time, to sections of the vertical transfer portion 14 that are located in identical positions in the column direction, and vertical transfer portion 14 in the other of the even-numbered column and the odd-numbered column among the plurality of vertical transfer portions 14 reads out, using readout electrode V2A, signal charges generated in infrared light pixels 13 included in another part of the plurality of second rows through exposure at the second exposure time shorter than the first exposure time, to sections of the vertical transfer portion 14 that are located in identical positions in the column direction.

Thus, signal charges generated in infrared light pixels 13 through exposure at two different exposure times are read out, therefore leading to an increased dynamic range of distance information obtained from infrared light pixels 13.

Furthermore, according to the drive timing illustrated in FIG. 15 and FIG. 18, using the transfer electrode, vertical transfer portion 14 in one of the even-numbered column and the odd-numbered column among the plurality of vertical transfer portions 14 or vertical transfer portion 14 in the other of the even-numbered column and the odd-numbered column among the plurality of vertical transfer portions 14 transfers, in the column direction, a first section of vertical transfer portion 14 in which a signal charge obtained through exposure at the first exposure time is held and a second section of vertical transfer portion 14 in which a signal charge obtained through exposure at the second exposure time is held, in such a manner as to align the first section and the second section in an identical row.

Thus, the signal charges obtained through exposure at two different exposure times are transferred in the column direction after the positions in vertical transfer portion 14 in which the signal charges are held are aligned in the same row, therefore leading to a shorter charge transfer period and a higher frame rate.

Although the solid-state imaging device and the distance-measuring imaging device according to the present disclosure have been described thus far based on the embodiment, the present disclosure is not limited to the embodiment. Various modifications of the present embodiment as well as different embodiments resulting from combinations of some of the structural elements in exemplary embodiments that may be conceived by those skilled in the art are intended to be included within the scope of the present disclosure as long as these do not depart from the essence of the present disclosure.

Figure 19:
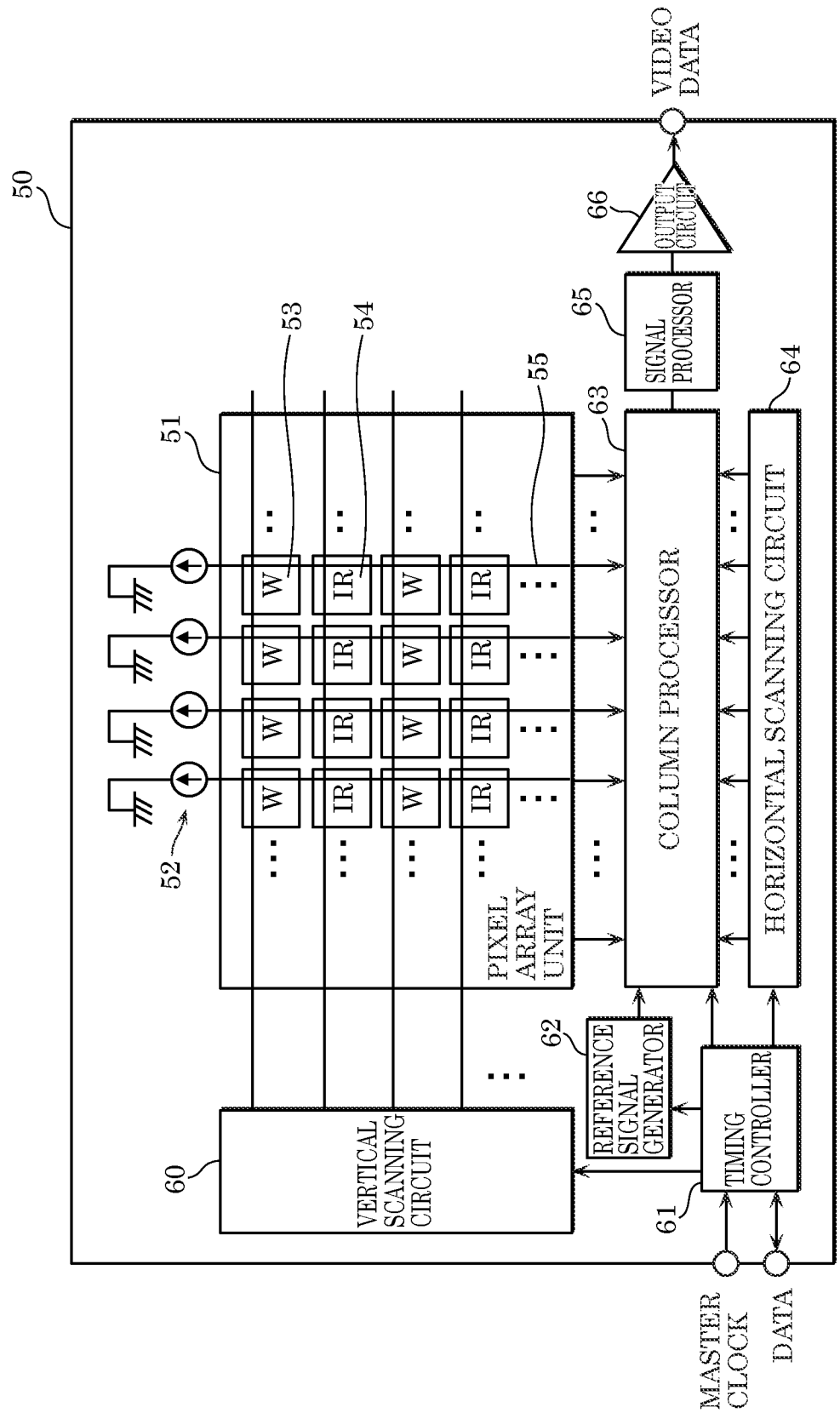
FIG. 19 is a diagram illustrating one example of the solid-state imaging device of the complementary metal-oxide-semiconductor (CMOS) image sensor type illustrated in FIG. 1.

For example, solid-state imaging device 10 is a CCD image sensor in the present embodiment, but may be a CMOS image sensor, as illustrated in FIG. 19.

In FIG. 19, CMOS image sensor 50 includes pixel array unit 51, vertical scanning circuit 60, timing controller 61, reference signal generator 62, column processor 63, horizontal scanning circuit 64, signal processor 65, and output circuit 66.

Pixel array unit 51 includes a plurality of pixels arranged in rows and columns. More specifically, pixel array unit 51 is formed by alternately disposing, in the column direction, a first row in which visible light pixels 53 each including a first photoelectric converter that converts visible light into a signal charge are arranged adjacent to each other in the row direction; and a second row in which infrared light pixels 54 each including a second photoelectric converter that converts infrared light into a signal charge are arranged adjacent to each other in the row direction. In pixel array unit 51, pixels arranged in the same column are connected to identical vertical signal line 55 to which constant-current source 52 is connected.

Vertical scanning circuit 60 outputs a control signal for each row of pixel array unit 51 under control of timing controller 61 (in other words, performs vertical scanning), causing column processor 63 to output a signal from a pixel via vertical signal line 55 on a per row basis. Timing controller 61 provides an operation timing instruction to each structural element of CMOS image sensor 50 according to the master clock and data input from the outside. Under control of timing controller 61, reference signal generator 62 generates a reference signal that is input to an A/D converter included in column processor 63.

Column processor 63 includes A/D converters and memories corresponding to the respective columns of pixel array unit 51; under control of timing controller 61, column processor 63 converts, into digital signals, signals input from pixel array unit 51 on a per column basis, stores the digital signals into the memories, and in accordance with control signals provided from horizontal scanning circuit 64, sequentially outputs the digital signals held in the memories to signal processor 65 while shifting the digital signals. Horizontal scanning circuit 64 outputs, to column processor 63, control signals for shifting the digital signals held in the memories of column processor 63, under control of timing controller 61. Signal processor 65 is a circuit that performs various processing on the digital signals output from column processor 63; for example, signal processor 65 performs substantially the same processing as signal processing circuit 40 in FIG. 1. Output circuit 66 is a buffer amplifier that outputs, to the outside, the digital signal output from signal processor 65.

Figure 20:
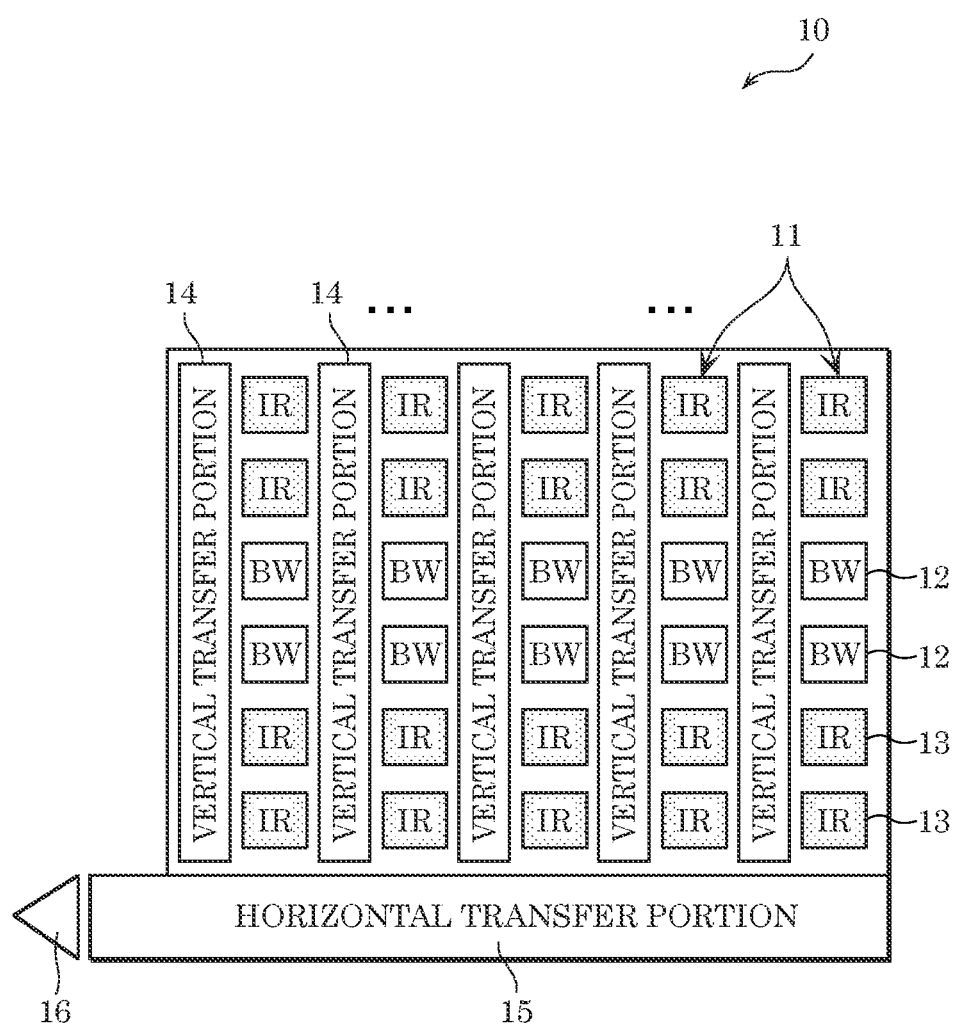
FIG. 20 is a diagram illustrating one example of the solid-state imaging device illustrated in FIG. 1 in which visible light pixels and infrared light pixels are arranged at intervals of two or more rows.

Furthermore, in imager 11 in FIG. 2, visible light pixels 12 are arranged adjacent to each other in the row direction, infrared light pixels 13 are arranged adjacent to each other in the row direction, and visible light pixels 12 and infrared light pixels 13 are disposed in stripes extending in the row direction, but this is not limiting; as illustrated in FIG. 20, visible light pixels 12 and infrared light pixels 13 may be positioned at intervals of two or more rows (as an example, at intervals of two rows in FIG. 20). In other words, the first row in which visible light pixels 12 are arranged adjacent to each other in the row direction and the second row in which infrared light pixels 13 are arranged adjacent to each other in the row direction may be alternately disposed at intervals of M rows (M is a natural number). Furthermore, the first row in which visible light pixels 12 are arranged adjacent to each other in the row direction and the second row in which infrared light pixels 13 are arranged adjacent to each other in the row direction may be positioned at intervals of a different number of rows (in such a manner that N first rows and L second rows (N and L are different natural numbers) are alternately repeated). For example, the rows may be positioned in such a manner that a series of two first rows and one second row are alternately repeated.

Furthermore, the first to fourth readout examples have been described in the above embodiment, and driving systems according to these readout examples may be applied to a solid-state imaging device (or a distance-measuring imaging device) so that one of the driving systems is selected and set in advance by an operator, or only one of the driving systems according to these readout examples may be applied to a solid-state imaging device (or a distance-measuring imaging device).

Furthermore, although only visible light pixels 12 are disposed in the first row in which visible light pixels 12 are arranged in imager 11 in the above embodiment, this is not limiting; the first row may include a pixel that receives light in other wavelength ranges (for example, infrared light).

Similarly, although only infrared light pixels 13 are disposed in the second row in which infrared light pixels 13 are arranged in imager 11 in the above embodiment, this is not limiting; the second row may include a pixel that receives light in other wavelength ranges (for example, visible light). As long as two infrared light pixels are disposed adjacent to each other in a part of the second row, the 2-pixel addition of infrared light pixels is possible, and thus a distance image is generated with high sensitivity.

Furthermore, although a distance image is generated using infrared light pixels 13 included in imager 11 of solid-state imaging device 10 in the above embodiment, the usage of infrared light pixels 13 is not limited to generation of a distance image and may be other usage such as observation of various properties of a subject. With solid-state imaging device 10 according to the present embodiment, both imaging information based on visible light pixels 12 and imaging information based on infrared light pixels 13 are obtained, and the imaging information based on infrared light pixels 13 is obtained with high sensitivity; thus, solid-state imaging device 10 can be used for various applications in which visible light imaging and infrared light imaging are performed at the same time.

Although only an exemplary embodiment of the present disclosure has been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

The solid-state imaging device according to the present disclosure generates a distance image and a visible image and is suited to generate the distance image with high sensitivity, and is therefore useful as a distance-measuring imaging device which accurately obtain a distance image and a visible image of a small subject, a distant subject, or the like. For example, the solid-state imaging device according to the present disclosure is useful for a distance-measuring imaging device including a distance-measuring camera application such as a smartphone supporting gesture input with a fingertip, a gaming machine which is controlled by the action of the whole body of more than one person, and a camera which is mounted on a vehicle and recognizes an object outside the vehicle.

What is claimed is:
1. A solid-state imaging device, comprising:
an imager including a plurality of pixels arranged in rows and columns, wherein the imager includes:
visible light pixels each including a first photoelectric converter which converts light in an entire wavelength range of visible light into a signal charge in order to generate a visible image; and
infrared light pixels each including a second photoelectric converter which converts infrared light into a signal charge in order to generate an infrared light image and a distance image indicating a time-of-flight (TOF) distance to a subject, and
a plurality of vertical transfer portions in one-to-one correspondence with columns of the plurality of pixels, each of the plurality of vertical transfer portions including: a readout electrode which reads out signal charges generated in the plurality of pixels; and a transfer electrode which transfers, in a column direction, the signal charges that have been read out,
wherein the imager is formed by alternately disposing a first row and a second row in a column direction, the first row being a row in which the visible light pixels are arranged adjacent to each other in a row direction, the second row being a row in which the infrared light pixels are arranged adjacent to each other in the row direction, and
each of the plurality of vertical transfer portions reads out, using the readout electrode, signal charges generated in two infrared light pixels adjacent to each other in the second row, to sections of the vertical transfer portion that are located in identical positions in the column direction, and adds up the signal charges.

2. The solid-state imaging device according to claim 1, wherein each of the plurality of vertical transfer portions reads out, using the readout electrode, signal charges generated in two visible light pixels adjacent to each other in the first row, to sections of the vertical transfer portion that are located in identical positions in the column direction, and adds up the signal charges.

3. The solid-state imaging device according to claim 2, wherein
a vertical transfer portion in one of an even-numbered column and an odd-numbered column among the plurality of vertical transfer portions reads out, using the readout electrode, signal charges generated in two visible light pixels adjacent to each other in the first row, to sections of the vertical transfer portion that are located in identical positions in the column direction, and adds up the signal charges, and
a vertical transfer portion in the other of the even-numbered column and the odd-numbered column among the plurality of vertical transfer portions reads out, using the readout electrode, signal charges generated in two infrared light pixels adjacent to each other in the second row, to sections of the vertical transfer portion that are located in identical positions in the column direction, and adds up the signal charges.

4. A solid-state imaging device, comprising:
an imager including a plurality of pixels arranged in rows and columns, wherein the imager includes:
visible light pixels each including a first photoelectric converter which converts light in an entire wavelength range of visible light into a signal charge in order to generate a visible image; and
infrared light pixels each including a second photoelectric converter which converts infrared light into a signal charge in order to generate an infrared light image and a distance image indicating a time-of-flight (TOF) distance to a subject, and
a plurality of vertical transfer portions in one-to-one correspondence with columns of the plurality of pixels, each of the plurality of vertical transfer portions including: a readout electrode which reads out signal charges generated in the plurality of pixels; and a transfer electrode which transfers, in a column direction, the signal charges that have been read out,
wherein the imager is formed by alternately disposing a first row and a second row in a column direction, the first row being a row in which the visible light pixels are arranged adjacent to each other in a row direction, the second row being a row in which the infrared light pixels are arranged adjacent to each other in the row direction, and
a vertical transfer portion in one of an even-numbered column and an odd-numbered column among the plurality of vertical transfer portions reads out, using the readout electrode, signal charges generated in infrared light pixels included in a part of a plurality of the second rows through exposure at a first exposure time, to sections of the vertical transfer portion that are located in identical positions in the column direction, and
a vertical transfer portion in the other of the even-numbered column and the odd-numbered column among the plurality of vertical transfer portions reads out, using the readout electrode, signal charges generated in infrared light pixels included in another part of the plurality of the second rows through exposure at a second exposure time shorter than the first exposure time, to sections of the vertical transfer portion that are located in identical positions in the column direction.

5. The solid-state imaging device according to claim 4, wherein the vertical transfer portion in one of the even-numbered column and the odd-numbered column among the plurality of vertical transfer portions or the vertical transfer portion in the other of the even-numbered column and the odd-numbered column among the plurality of vertical transfer portions transfers one of first and second sections of the vertical transfer portion in the column direction using the transfer electrode, to align the first section and the second section in an identical row, the first section being a section in which a signal charge obtained through the exposure at the first exposure time is held, the second section being a section in which a signal charge obtained through the exposure at the second exposure time is held.

6. A distance-measuring imaging device, comprising:
a light source unit which emits infrared light;
the solid-state imaging device according to claim 1;
a control circuit which controls the light source unit and the solid-state imaging device to cause the visible light pixels to receive visible light and further cause the infrared light pixels to receive reflected light obtained by reflecting, by the subject, the infrared light emitted by the light source unit; and
a signal processing circuit which generates the visible image by reading out signal charges generated in the visible light pixels and generates the distance image and the infrared light image by reading out signal charges generated in the infrared light pixels.

* * * * *